United States Patent [19]

Tanimoto et al.

[11] Patent Number: 5,597,590
[45] Date of Patent: Jan. 28, 1997

[54] APPARATUS FOR REMOVING A THIN FILM LAYER

[75] Inventors: Akikazu Tanimoto; Kiyoshi Motegi; Yukako Komaru, all of Kanagawa, Japan

[73] Assignee: Nikon Corporation, Tokyo, Japan

[21] Appl. No.: 563,349

[22] Filed: Nov. 28, 1995

Related U.S. Application Data

[63] Continuation of Ser. No. 384,444, Feb. 2, 1995, abandoned, which is a continuation of Ser. No. 200,353, Feb. 22, 1994, abandoned, which is a continuation of Ser. No. 803,644, Dec. 4, 1991, abandoned, which is a continuation-in-part of Ser. No. 657,460, Feb. 19, 1991, abandoned.

[30] Foreign Application Priority Data

| Feb. 20, 1990 | [JP] | Japan | 2-039236 |
| Mar. 5, 1990 | [JP] | Japan | 2-051901 |
| Dec. 5, 1990 | [JP] | Japan | 2-404633 |

[51] Int. Cl.$^6$ .................................................. B23K 26/08
[52] U.S. Cl. ........................ 425/174.4; 219/121.61; 219/121.62; 219/121.68; 264/400
[58] Field of Search ........................ 264/400, 482; 219/121.6, 121.61, 121.62, 121.63, 121.67, 121.68, 121.69, 121.73, 121.82; 156/643, 646; 425/174.4, 174

[56] References Cited

U.S. PATENT DOCUMENTS

| 3,814,895 | 6/1974 | Fredriksen | 219/121.68 |
| 3,889,355 | 6/1975 | Aronsatein et al. | |
| 4,504,726 | 3/1985 | Hosaka et al. | 219/121.68 |
| 4,752,668 | 6/1988 | Rosenfield et al. | |
| 4,780,617 | 10/1988 | Umatate et al. | |
| 4,900,939 | 2/1990 | Aoyama | |
| 5,211,805 | 5/1993 | Srinivasan | 219/121.67 |
| 5,266,136 | 11/1993 | Kanome et al. | 264/1.33 |
| 5,279,775 | 1/1994 | Thomas et al. | 264/400 |
| 5,359,173 | 10/1994 | Opdyke | 264/400 |
| 5,455,815 | 10/1995 | Ishida et al. | |

OTHER PUBLICATIONS

SPIE, vol. 538, Optical Microlithography IV (1985), pp. 9–16, "Laser step alignment for a wafer stepper".

*Primary Examiner*—Mathieu D. Vargot
*Attorney, Agent, or Firm*—Michael N. Meller

[57] ABSTRACT

A method and apparatus whereby a thin film layer, e.g., a resist covering at least selected patterns formed on a surface of a substrate, e.g., a wafer is removed from a limited localized portion at a predetermined position relative to each of the patterns, such as, an alignment mark portion of the pattern in response to the irradiation of an energy beam. The substrate is positioned on a turn table and the position of a selected portion of the pattern is detected on the turn table. In accordance with the detected position of the selected portion and design coordinate position information of the pattern, the position of the localized portion requiring removal of the thin film layer is determined by means of a polar coordinate system based on a center of rotation of the turn table so that in accordance with the determined polar coordinate values the energy beam is irradiated on the thin film layer of the localized portion.

10 Claims, 20 Drawing Sheets

PRIOR ART

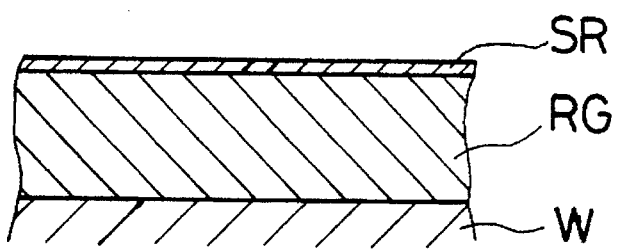
F I G.18A
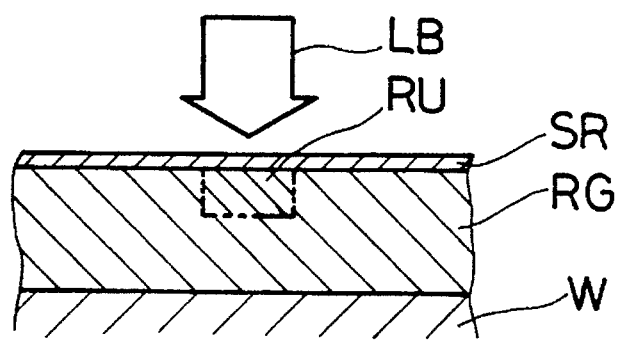
F I G.18B
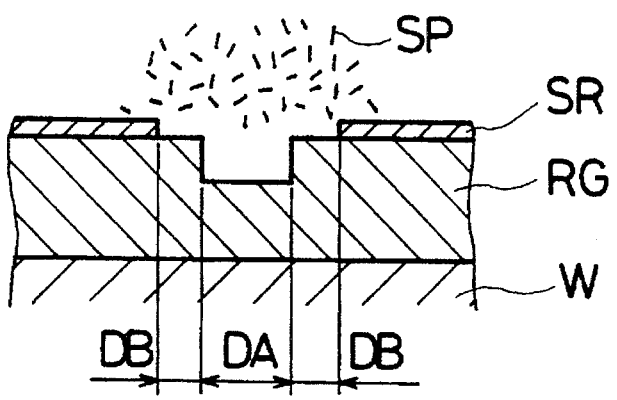
F I G.18C
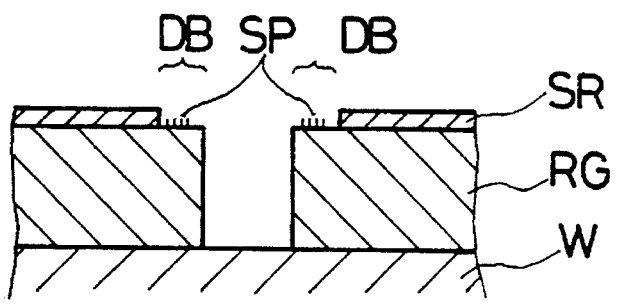
F I G.18D

APPARATUS FOR REMOVING A THIN FILM LAYER

This application is a continuation of application Ser. No. 08/384,444, filed Feb. 2, 1995, now abandoned, which is a continuation of application Ser. No. 08/200,353, filed Feb. 22, 1994, now abandoned, which is a continuation of application Ser. No. 07/803,644, filed Dec. 4, 1991, now abandoned, which is a continuation-in-part of application Ser. No. 07/657,460, filed Feb. 19, 1991, now abandoned.

BACKGROUND OF THE INVENTION

1. Field of the Invention

The present invention relates to techniques of locally removing the thin film layer covering the surface of a substrate such as a semiconductor wafer, and more particularly to a method and apparatus whereby in order to improve the performance of lithographic apparatus (particularly, exposure apparatus) used in the manufacture of semiconductor integrated circuits, the thin film layer of a photosensitive material or the like covering the surface of a substrate preliminarily formed with patterns such as ICs is locally removed.

2. Description of the Prior Art

With the recent trend toward increasing the level of integration of VLSI patterns, the minimum line width of circuits has been decreased. It is expected that an excimer stepper using a deep ultra violet (UV) light source, e.g., a KrF (fluosilicate krypton) excimer laser having a wavelength of 248 nm as a light source will be mainly used for the manufacture of the next-generation memories whose minimum line width is on the order of 0.35 μm on semiconductor chips or 64 Mbit D-RAMs (Dynamic Random Access Memories).

With this type of excimer stepper, it is desirable that an alignment measurement (mark detection) of the through-the-lens (TTL) system is effected through a reticle serving as a projection negative in order to improve the accuracy of the alignment (particularly, the wafer alignment).

In the case of this TTL system through a reticle, it is not possible to make an excellent mark position measurement unless light of the same wavelength as the exposure light is used as an illuminating light for detecting the alignment marks on a wafer.

The reason is that the projection lens system used in the excimer syepper has an intense chromatic aberration so that the image forming conjugatory relation between the reticle and the wafer cannot be maintained by use of a non-exposure light such as a visible light.

In view of these circumstances, it has been conceived to use an excimer laser light divided from the same light source as the exposure light as an illuminating light for the TTL-type alignment of the excimer stepper. Where the excimer laser light is used for detecting the marks on a wafer, however, there are many cases in which the excimer laser light is intensely absorbed by the resist layer uniformly applied onto the wafer. In the case of a novolac-type photoresist, e.g., MP-2400 (the tradename of Shipley Co.), for example, the photoresist layer applied to a thickness of 1 μm has a transmittance of as low as 5 to 8% and also the quantity of the light reflected from the mark and returned to the projection lens system represents a double-trip transmittance through the reisist layer thus allowing to expect only the transmittance of about 0.64% at the most.

Such a low transmittance can never permit the alignment measurement so that even if the mark detection itself is possible, its position measuring accuracy and repeatability are deteriorated extremely.

Thus, as a measure to counter it, it has been conceived to locally remove the resist layer only on the alignment mark portions prior to the alignment operation.

FIGS. 17A and 17B show a conventional method in which the resist layer on the mark portions is removed through the exposure and development due to the projection of a light beam.

FIG. 17A shows the manner in which a resist removing apparatus is incorporated in a stepper. In this case, the stepper comprises a mercury lamp HG, a condenser lens CL, a reticle R, a projection lens PL and a stage ST for moving a wafer W in x and y directions in a step-and-repeat mode, and the resist removing apparatus includes a composite tube assembly TB.

FIG. 17B shows the construction of one forward end of the tube assembly TB, and in this case the tube assembly TB includes an outer tube OP, an inner tube IP coaxially inserted into the outer tube OP with a gap formed therebetween, an optical fiber FB inserted into the inner tube IP with a gap therebetween and having a lens GL at the forward end, and an annular packing PK provided at the forward end face of the outer tube OP.

Formed on the surface of the wafer W as shown in FIG. 17B are alignment marks M so that a coating AL to be photo etched is formed on the marks M and a resist layer Pr is applied onto the top surface. The tube assembly TB is vertically movable in the condition of FIG. 17A so that when the resist layer Pr is to be removed, the tube assembly TB is lowered so as to be pressed against the resist layer Pr through the packings PK as shown in FIG. 17B.

Then, where the resist layer Pr is the positive type, an exposure light IL is projected onto each mark M from the lens GL through the optical fiber FB. Then, a developing solution is supplied to the resist layer Pr through inside the inner tube IP and the developing solution is discharged toward an absorbing unit which is not shown through the space between the inner tube IP and the outer tube OP. Then, a rinsing solution is supplied through the inner tube IP thereby rinsing the developed portion enclosed by the packing PK. Then, $N_2$ (nitrogen) gas is supplied from the inner tube IP thereby effecting the drying. When the removing of the resist is completed in this way, the tube assembly TB is moved upward to separate from the wafer W and then the ordinary alignment operation and exposure operation are initiated.

It is to be noted that in order to locally remove the resist layer, in addition to the above-mentioned photolithographic method, a photo etching method requiring no post developing operation may be used so that in this case a high-energy ultraviolet light beam such as an excimer laser beam is projected onto the resist layer Pr near the mark M to break the molecular bond of the resist and the vaporized and scattered molecules and the remaining fine particles are purged and discharged while supplying $N_2$ gas from the inner tube IP.

In the above-mentioned conventional method, the component part for removing the resist layer Pr (the packing PK at the forward end of the tube TB) is pressed against the surface of the wafer and thus there is the great danger of causing defects (flaws, etc.,) on the resist layer, thereby making it impossible to put the method as such into practical use.

Moreover, in accordance with the conventional method the component part for removing the resistor layer Pr is pressed against the wafer surface to remove the resist so that during the interval the cleanliness of the wafer surface cannot be maintained and also the resist removal at an economically adequate rate cannot be effected.

A conventional apparatus requires that a wafer is mounted in a prealigned condition on an X-Y stage ST and for this purpose it is necessary to provide a prealignment station based on the external shape of wafers and a transfer unit (e.g., a loader arm) for the X-Y stage ST, thus inevitably decreasing the processing speed. Also, since the X-Y stage ST is used for the positioning of a part (the tubes TB) of the removing apparatus relative to the localized portions (the mark portions) to be removed on the resist layer, the operations for moving and positioning the stage are required and the throughput is inevitably deteriorated in cases involving a large number of portions to be removed.

SUMMARY OF THE INVENTION

It is the primary object of the present invention to provide a method and apparatus for removing only the localized portions of a thin film layer, e.g., a resist layer on the surface of a substrate such as wafer in a short period of time without deteriorating the cleanliness of the substrate surface.

It is another object of the present invention to provide a method and apparatus for removing only the localized portions of such thin film layer without causing any contamination of the surface of the thin film layer even if a higher energy beam is used.

In accordance with the basic idea of the present invention, the above object is accomplished by fixedly mounting a substrate such as a wafer on a turn table and then determining the positions of the localized portions (e.g., the alignment mark portions) of a thin film layer on the substrate which are to be removed in accordance with the polar coordinate system due to the rotation of the turn table. Applicable to the selective removal of the thin film layer after the position determination are a photolithographic method whereby a sensitizing light beam is projected to the thin film layer and then the thin film layer is subjected to a developing process as well as a photo etching method which projects the previously mentioned high-energy beam to the thin film layer.

While the alignment marks, etc., on a wafer are usually arranged according to the rectangular coordinate system, the present invention is such that the position of such mark is detected by detecting means (alignment sensors) and its mark position or other mark position is converted to polar coordinate values in accordance with the rotational angle of a turn table at the time of the detection of the mark and the distance from the centers of rotation of the turn tabel. As a result, as far as the rotational angle of the turn table is determined, the position of any localized portion on the wafer is determined according to the polar coordinate system with respect to the beam from beam irradiating means for thin film layer removing purposes.

This position determination is effected by a control of the angular position of the turn table and a control of the relative positions of the beam irradiating means and the turn table in the radial direction. Then, if the beam irradiating means includes a light source such as a pulse laser beam, with the turn table being rotated, the beam irradiating means is caused to produce pulses in synchronism with its rotational angle thus effecting an extremely high speed removing processing. In addition, the turn table for effecting the removal of localized portions of the thin film layer can be concurrently used as a spinner for a resist coater, a developer or a combined coater/developer which is usually installed within the wafer feed system for the stepper and in this case not only there is the effect of eliminating the need for separately preparing a space for an exclusive resist partial removing apparatus in the photolithographic process but also there is the effect of reducing the time loss due to the addition of the wafer transfer to zero.

In accordance with the present invention, with a substrate mounted on the turn table, a positional shift of the pattern on the substrate is measured on the rotating coordinate system centering the rotating shaft of the turn table and the irradiation of the beam for the local removal of the thin film layer on the surface of the substrate is effected with the substrate being placed on the same turn table, there is no need to transfer the substrate and the removing process can be effected in a short period of time. Also, since the thin film layer on its surface is removed with the substrate being mounted on the turn table, even if the thin film layer is scattered by the pulse light, e.g., a laser light, to remove the thin film layer while rotating the substrate has the advantage of causing the flying splinters of the thin film to fly off to the outer side radially due to the centrifugal force and making it defficult to cause the splinters to remain on the substrate surface.

Also, the turn table can be concurrently used as the spinner for the coater/developer or the like so that even if the splinters remain, the turn table can be cleaned with a fluid.

Where it is desired to effect a selective exposure of a positive resist, the possibility of occurrence of dust can be eliminated by developing the resist on the turn table.

On the other hand, where the removal of the thin film layer is effected by use of the photo etching method in accordance with the present invention, if the energy density of the irradiated beam is high, a rapid temperature rise is caused in the surface portion of the thin film layer exposed to the beam so that there is the danger of causing the thin film-layer portion to be scattered in the form of thin pieces or a pumping loss due to a stress caused by the difference in thermal expansion between the surface portion and the layer beneath it. In this case, in accordance with the present invention there is nothing which contacts with the locally removed portion of the thin film layer so that the scattered thin pieces deposit on and contaminate the thin film layer surface in the vicinity of the beam irradiated area thus impeding the following semiconductor manufactureing operation. To deal with such situation, in accordance with another aspect of the present invention, prior to the selective removal of the thin film layer, the whole surface of the thin film layer is coated preliminarily with a contamination preventive film so that an energy beam is locally irradiated from above on the contamination preventive film to remove both of the contamination preventive film and the thin film layer in the localized portions and then the contamination preventive film on the unremoved thin film layer is removed thereby overcoming the problem. By thus applying a contamination preventive film onto the whole surface of the thin film layer prior to the irradiation of the energy beam, all of the scattered thin pieces due to a pumping phenomenon or the like are deposited on the contamination preventive film. The thus deposited thin pieces on the contamination preventive film are removed along with the contamination preventive film after the irradiation of the energy beam and therefore there is no danger of the thin pieces being left on the remaining thin film layer.

Any materials satisfying the following conditions can be used for the contamination preventive film.

a: It can be dissolved and removed by a solvent which does not dissolve the thin film layer.

b: It absorbs the irradiated energy beam. If the contamination preventive film itself does not practically absorb the beam, even if the thin film layer beneath it is good in absorbing properties, a situation arises in which the contamination preventive film still remains on the thin film layer and after all the thin film in the irradiated portion is not removed.

c: There is no danger of it being dissolved into or mixed with the thin film layer during its application onto the thin film layer. While it is not absolutely necessary that the thin film layer and the contamination preventive layer are not dissolved into or mixed with each other, it is necessary that no irregularities or the like tending to impede the post operations are caused in the surface of the thin film layer when the contamination preventive film alone is removed at a later time.

The above and other objects, construction and advantages of the present invention will be more readily understood from the following illustrative description taken in conjunction with the accompanying drawings.

BRIEF DESCRIPTION OF THE DRAWINGS

FIGS. 18A, 18B, 18C and 18D are diagrams showing exemplary result removing steps having any possibility of causing contamination.

DESCRIPTION OF THE PREFERRED EMBODIMENTS

Figure 1:
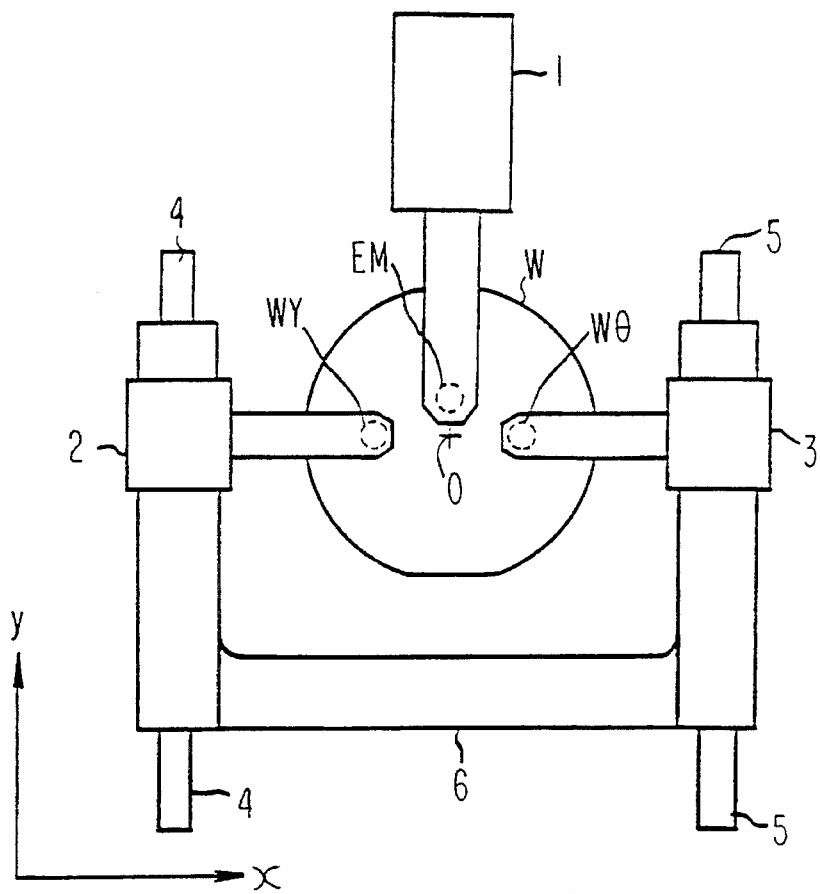
FIG. 1 is a plan view schematically showing the overall construction of a thin film removing apparatus according to a first embodiment of the present invention.
Figure 2:
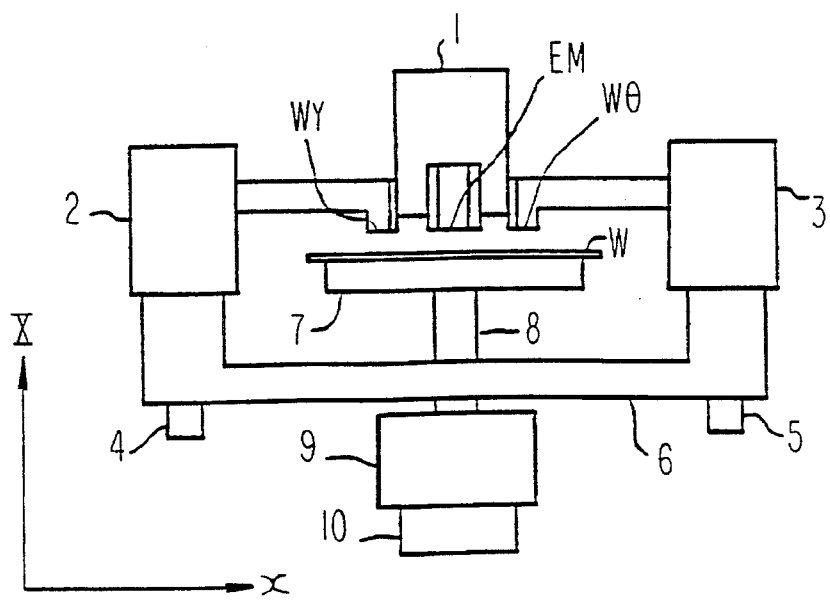
FIG. 2 is a front view of the apparatus of FIG. 1.

FIG. 1 is a plan view of a resist removing apparatus according to a first embodiment of the present invention, and FIG. 2 is a front view of the apparatus. A wafer W is held fast by means of vacuum on a wafer holder (turn table) 7 fixedly mounted on a rotating shaft 8. The turn table 7 is rotated by a rotary driver 9 such as a motor and the rotational angle of the rotating shaft 8 is detected by a detector 10. The wafer W is formed with a circuit pattern as well as alignment marks, and a photosensitive resist is applied onto them to a uniform coating thickness. The rotating shaft 8 is supported by a precision bearing such as an air bearing and it is made so that its radial play during the rotation is less than 1 μm and the central axis of rotation of the rotating shaft 8 is perpendicular to the vacuum holding surface of the wafer holder 7. Also, the rotational angle detector 10 comprises a detector such as an optical rotary encoder or a magnetic rotary encoder and it is capable of effecting the angle detection with a resolution and accuracy of 1 second or less. Although not shown, there are incorporated a loader for automatically loading and unloading the wafer W from the wafer holder 7 and a mechanism operatively associated with the loader to facilitate the transfer of the wafer W and these techniques are well known in the art thus requiring no particular explanation thereof. Of course, it is desirable to incorporate a mechanism for centering the wafer center and the center of the rotating shaft 8 on the basis of the peripheral form of the wafer W.

Designated as WY and Wθ are alignment detection sensors which are respectively arranged at the forward end portions of a Y-sensor optical system 2 and a θ-sensor optical system 3. The Y-sensor optical system 2 and the θ-sensor optical system 3 are coupled to each other by a connecting member 6 and are respectively capable of linear motion along rails 4 and 5 in a y direction. Their positions in the y direction are measured by a coordinate measuring device which is not shown, such as, a laser interferometer or linear encoder and their positioning is effected by motors. Also, they are capable of making constant speed motion. The Y sensor WY and the θ sensor Wθ are also movable in an x direction and their actual positions are measured by a coordinate measuring device, e.g., a linear encoder. Also, these sensors can be positioned automatically by motors.

A resist removing light irradiation optical system 1 includes a light irradiator EM at its forward end and the light irradiator EM is movable along a rail (not shown) in substantially the radial direction (the y direction) centering the center of rotation 0 of the table 7. The moved position of the light irradiator EM can be measured by a precision coordinate measuring device such as a laser interferometer and its position can be automatically set by a motor. Also, the light irradiator EM (or the whole optical system 1) can make a slight motion in the x direction.

Figure 3:
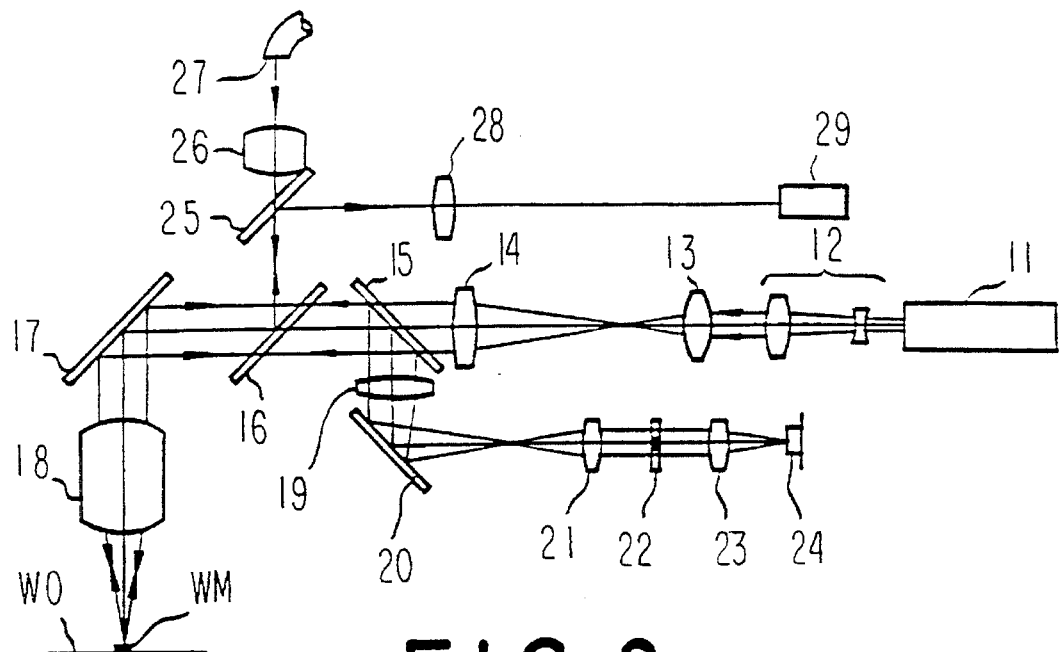
FIG. 3 is an optical path diagram showing an example of the construction of an alignment sensor optical system.

The WY-sensor optical system 2 and the Wθ-sensor optical system 3 are the same in internal optical arrangement and this internal optical arrangement is shown in FIG. 3. A light source 11 comprising an He-Ne laser or the like which directs a non-sensitizing laser beam onto the resist on the surface of the wafer W, and this laser beam is passed through a beam expander 12, a cylindrical lens 13, a relay lens 14, a beam splitter 15, a dichroic mirror 16, a mirror 17 and an objective lens 18 in this order, thereby forming an elongated laser spot on the surface WO of the wafer W. When this laser beam falls on an alignment mark WM formed in the form of a diffraction grating on the wafer surface, a diffracted light is produced and this diffracted light is passed through the objective lens 18, the mirror 17 and the dichroic mirror 16 to reach the beam splitter 15 from which the diffracted light is directed to a spatial filter 22 through a relay lens 19, a mirror 20 and a relay lens 21. The spatial filter 22 selectively passes only the diffracted light so that the diffracted light is condensed by a condenser lens 23 and directed to a detector 24 which in subjects the condensed light to photoelectric conversion. This type of alignment detection system is well known in the art by the Proceedings of SPIE Vol. 538 (1985), pp. 9–16 and it has already been used in the manufacture of LSIs giving the actual results.

In FIG. 3, an optical fiber 27 directs an image observing illuminating light from the dichroic mirror 16 in the principal optical system to the wafer surface through a condenser lens 26 and a beam splitter 25 and through the objective lens 18 and the image on the wafer surface is focused on an imaging device 29 from the dichroic mirror 16 through the beam splitter 25 and a relay lens 28. Light in such wavelength region which does not sensitize the resist is used for the image observing illuminating light.

Connected to the imaging device 29 is an image processing circuit (not shown) whereby the image signal resulting from the observation of the mark on the wafer W is processed to automatically measure the position of the mark.

Figure 4:
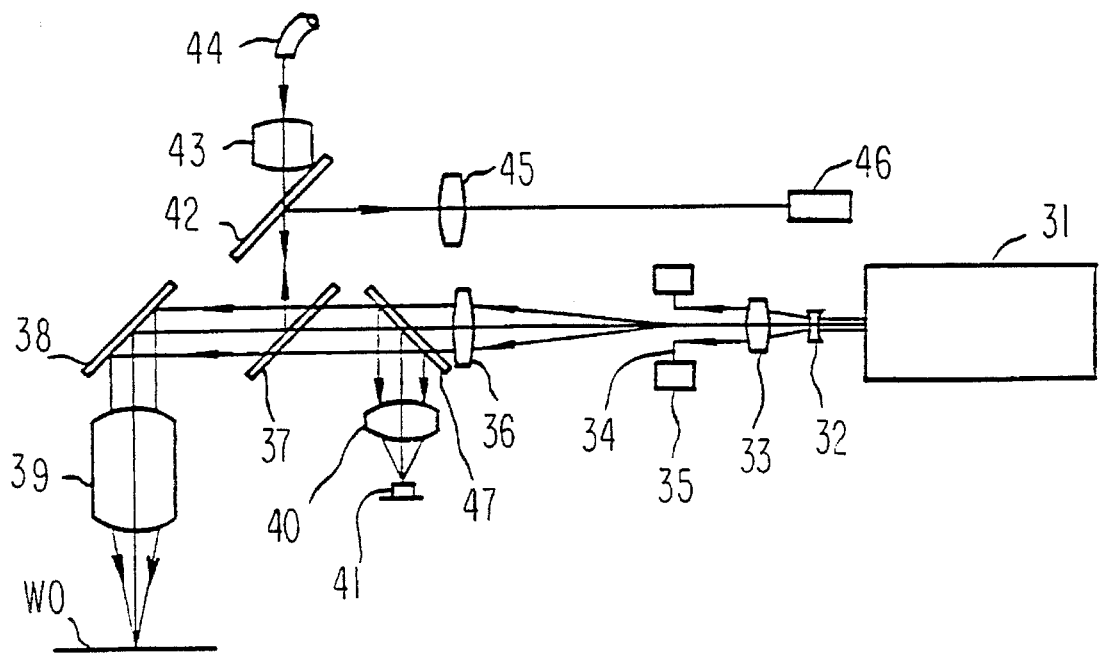
FIG. 4 is an optical path diagram showing an example of the construction of a resist removing processing light irradiating optical system.

Referring to FIG. 4, there is illustrated a schematic diagram showing a detailed construction of the resist removing light irradiation optical system 1. A laser light source 31 comprises an excimer laser such as KrF or ArF or XeCl, a YAG laser, a semiconductor laser or copper steam laser and it produces a laser output beam or a pulse-like laser beam which is high for example in harmonic peak power. This laser beam is converted into substantially a collimated beam through the action of a concave lens 32 and a convex lens 33. A variable aperture 34 is in the form of a rectangular opening in which the lengths of the adjacent two sides are independently settable with the central symmetry and it is also rotatable about the optical axis passing through the center of the opening by turning means 35. Its rotational angular position can be read by a rotary encoder or the like and it is settable to a given angular position by a motor. The image of the variable aperture 34 is projected in reduced form onto the surface WO of the wafer W through the action of a relay lens 36 and an objective lens 39. Arranged between the relay lens 36 and the objective lens 39 is a beam splitter 47 which functions, along with a condenser lens 40, to introduce the reflected light of the laser beam from the wafer surface WO into a photoelectric detector 41 and thus it is possible to monitor whether the resist on the wafer surface WO has been removed by the laser beam. An optical fiber 44 directs an illuminating light, which is non-sensitizing to the resist, to a dichroic mirror 37 through a condenser lens 43 and a beam splitter 42 to illuminate the wafer surface WO. As a result, the enlarged image of the wafer surface WO, enlarged by the objective lens 39, is formed on an imaging device 46 through the beam splitter 42 and a relay lens 45 from the dichroic mirror 37. The dichroic mirror 37 slightly reflects the wavelength region of the light emitted from the laser light source 31 and in this way the position of the irradiation point can be observed by use of the imaging device 46.

In order to chage the x-direction positions of the Y sensor WY and the θ sensor Wθ in FIGS. 1 and 2, while the whole optical system of FIG. 3 may be moved, only the mirror 17 and the objective lens 18 may be caused to make a parallel movement. In the latter case, however, the afocal performance on the image side of the objective lens 18 is required.

Also, in order to change the position of the light irradiator EM of the light irradiation optical system 1 relative to the center of rotation 0, while moving only the objective lens 39 and the mirror 38 parallely has the effect of reducing the moving parts in size, in this case the image side of the objective lens 39 must also be afocal.

Figure 5A:
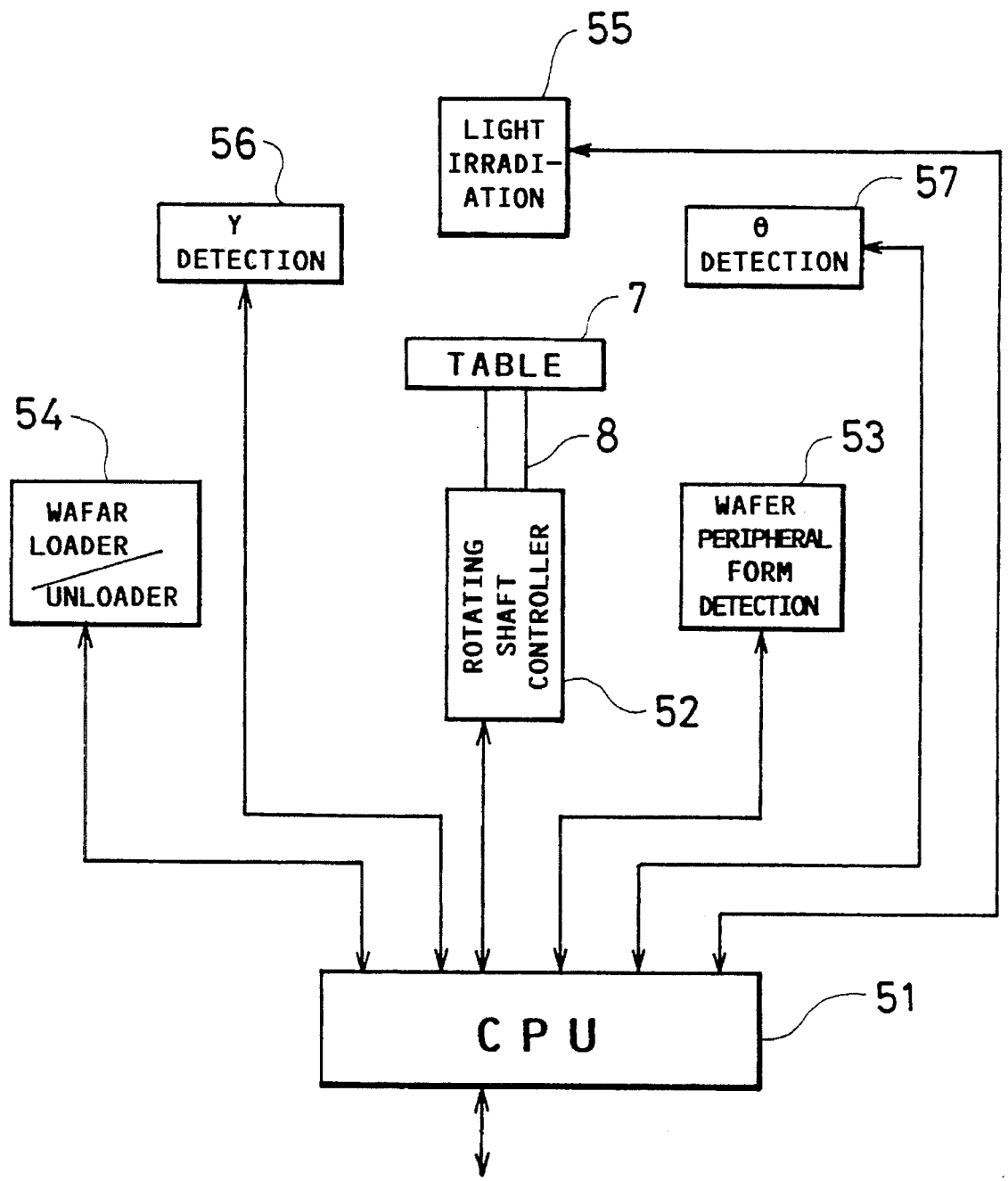
FIG. 5A is a block diagram schematically showing the control system of the thin film removing apparatus of the first embodiment.

FIG. 5A is a block diagram showing the principal component parts of the control system of the present embodiment which are roughly classified by function, and a rotating shaft controller 52 for controlling the rotation of the rotating shaft 8 of the wafer holder 7 receives from a CPU 51 an on/off command for a vacuum chuck for the wafer W, commands relating to angles for rotational angular positioning and the execution thereof, commands relating to the rotational speed in the case of a constant speed rotation and the execution thereof, commands for up/down movements of the table 7 to facilitate the transfer in the case of loading and unloading the wafer W and commands for focusing purposes, and also it sends rotational position information and other information relating the the conditions of the rotating shaft 8 and the wafer holder 7.

A Y detection block 56 and a θ detection block 57 are blocks respectively corresponding to the WY-sensor optical system 2 and the Wθ-sensor optical system 3. These blocks receive x and y set coodinate position information and movement commands and generate x and y coordinate position information and measured alignment mark position information.

A light irradiation block 55 corresponding to the light irradiation optical system 1 receives from the CPU 51 set position information and positioning commands for the light irradiator EM, opening information and setting information for the variable aperture 34, the rotational angles and setting commands for the variable aperture 34, laser output generating commands for the laser 31 and irradiation amount (energy quantity) command signals, and it sends information relating to the conditions of the light irradiation block 55 itself to the CPU 51.

A wafer peripheral form detection block 53 measures the positions of the flat portion and circumferential portion or the notch portion on the outer periphery of the wafer W or the amount of eccentricity relative to the center of rotation O, etc., and it sends these information to the CPU 51.

A loader/unloader block 54 for the wafer W is responsive to a command from the CPU 51 to load the wafer W from a cassette or a track onto the wafer holder of the turn table 7 or unload the wafer W from the wafer holder 7.

Figure 5B:
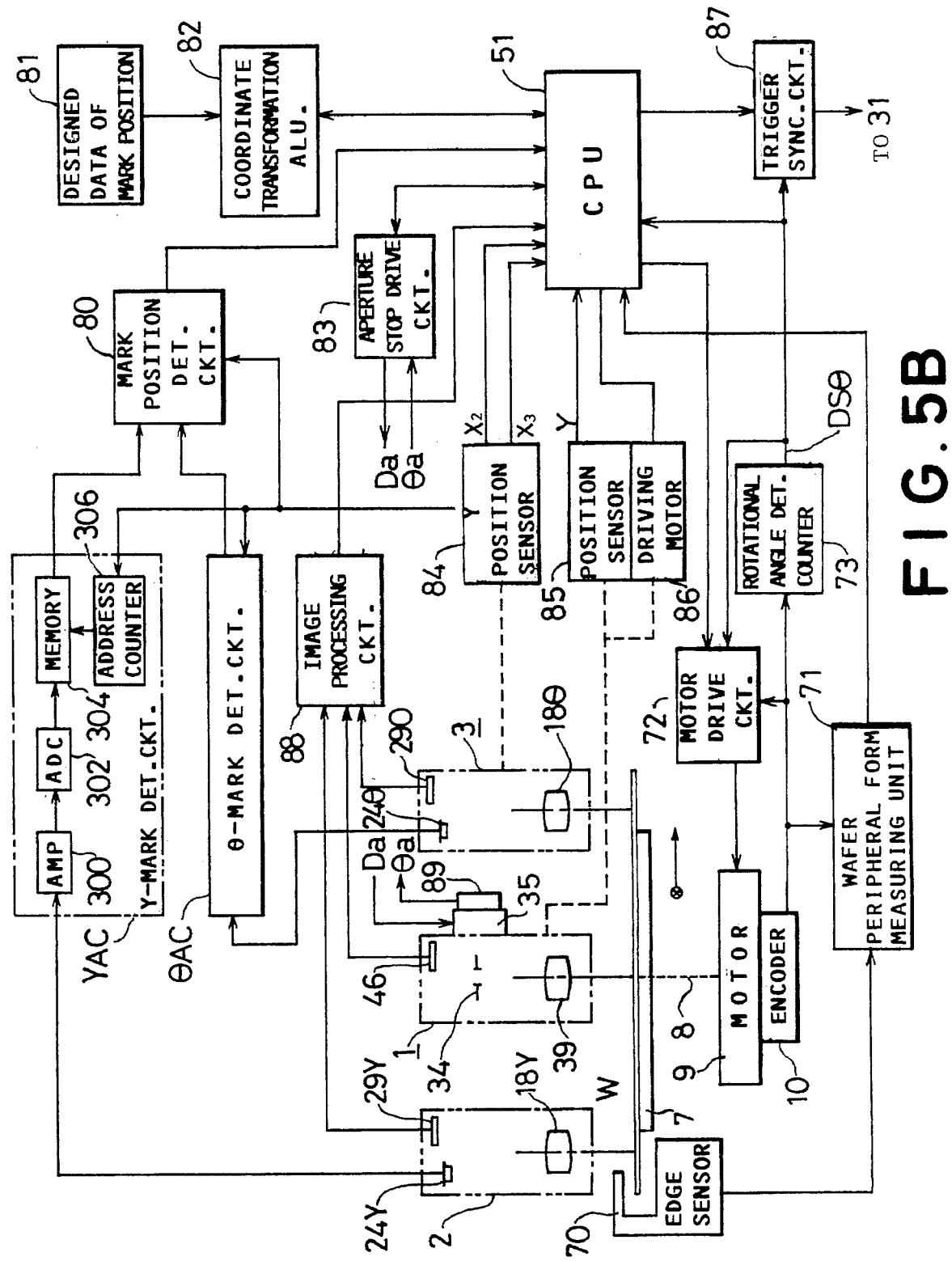
FIG. 5B is a block diagram showing in detail the construction of the control system of the first embodiment.

FIG. 5B is a circuit block diagram showing in detail the blocks in FIG. 5A and the counterparts to the members shown in FIGS. 1 to 4 are designated by the same reference numerals. After the wafer W has been substantially centered and held fast by vacuum on the turn table 7, the direction of the orientation flat (or notch) of the wafer W must be aligned with one direction while driving the motor 9. For this purpose, a photoelectric edge senser 70 and a wafer peripheral form measuring unit 71 are provided. The wafer peripheral form measuring unit 71 detects the center position of the wafer flat (or notch) in accordance with angle pulse signals from the angle detector 10 (hereinafter referred to as an encoder) and the variations of a signal from the edge sensor 70 and send its information to the CPU 51.

The pulse signals from the encoder 10 are also sent to a drive circuit 72 of the motor 9 and a rotational angle detection counter 73.

The pulse signals from the encoder 10 are utilized for speed control purposes in the drive circuit 72 and the pulse signals are also counted digitally in the counter 73 so as to be utilized for measuring the rotational angle of the table 7 with a resolution of 1 second or less. The count value DSθ of the counter 73 is sent to the drive circuit 72, the CPU 51 and a trigger synchronizing circuit 87. The count value DSθ primarily corresponds to the rotational angular position of the table 7 which is in the range of 0 to 360 degrees and the drive circuit 72 utilizes the count value DSθ as positional deviation information (the current value input to the survo system) during the rotational positioning of the table 7.

The trigger synchronizing circuit 87 compares the angular position designated by the CPU 51 and the count value DSθ so that the laser light source 31 is triggered into pulse oscillation when the table 7 is placed in a given rotational angular position.

On the other hand, in the Y-sensor optical system 2 (its objective lens is designated at 18Y) the photoelectric signal from an alignment detector 24Y is applied to a Y-mark detecting circuit YAC. The detecting circuit YAC includes an amplifier 300, an analog-digital converter (ADC) 302, a memory 304 and an address counter 306 and the waveform information of the photoelectric signal is stored in correspondence to the position in the memory 304.

The θ-mark detecting circuit θ AC has the similar construction as the Y-mark circuit YAC and the internal memory (not shown) of the detecting circuit θ AC stores the signal waveform from an alignment detector 24θ in the θ-sensor optical system 3 (its objective lens is designated as 18θ). The address counter 306 of the detecting circuit YAC and the address counter (not shown) of the detecting circuit θ AC are each adapted to count the position pulse signals from a position sensor 84 for detecting the y-direction position of the Y-sensor optical system 2 or the θ-sensor optical system 3. Also, the position sensor 84 applies to the CPU 51 information $X_2$ indicating the x-direction position of the alignment system WY at the forward end of the Y-sensor optical system 2 and information $X_3$ indicating the x-direction position of the alignment system Wθ at the forward end of the θ-sensor optical system 3.

A position sensor 85 detects the y-direction position of the light irradiator EM at the forward end of the light irradiation optical system 1 and this position information is applied to the CPU 51. A driving motor 86 is responsive to a command from the CPU 51 to move the light irradiator EM in the y-direction. Also, in the light irradiation optical system 1 the variable aperture 34 is rotated by the driver (motor) 35 and its angle is detected by an encoder 89. The operation of the motor 35 is effected by an aperture stop drive circuit 83 which reads angle information θ a from the encoder 89. The drive circuit 83 servo controls the motor 35 in such a manner that the set desired angle applied from the CPU 51 and the angle information from the encoder 89 coincide.

An image processing circuit 88 electrically processes the image signals from an imaging device 29Y in the Y-sensor optical system 2, an imaging device 29θ in the θ-sensor optical system 3 and an imaging device 46 in the light irradiation optical system 1 so that any one-dimensional or two-dimensional positional deviation of the mark or any particular linear pattern present in the field of view of each of the objective lenses 18Y, 18θ and 39 is detected and its result is supplied to the CPU 51.

A mark position detecting circuit 80 processes the signal waveforms stored in the detecting circuits YAC and θ AC to determine the y-direction position of the mark on the wafer W as values on the rectangular coordinate system and this position information is applied to a coordinate transformation ALU 82. The ALU 82 receives information of the mark position requiring removal of the resist on the wafer W from a designed data of mark position unit 81 so that in accordance with the actually measured mark position values detected by the detecting circuit 80 the mark position requiring the resist removal is converted to a polar coordinate form (a radius r and an angleθ).

These coordinate values are applied to the CPU 51 so that the parameter relating to the radius r is used for controlling the driving motor 86 and the parameter relating to the angle θ is used for the control of the aperture stop drive circuit 83, the setting of a command value for the trigger synchronization circuit 87, etc.

Next, the positioning method used in this embodiment will be described. In accordance with the present embodiment, the positioning of the resist removing beam is effected by the polar coordinate system 0-rθ centering the center of rotation 0 of the wafer holder 7. This method differs from the concept of positioning by the rectangular. coordinate system used for the arrangement of the circuit patterns (chips) and marks within the ordinary wafer and it can be said to be a new method. To explain in terms of the principle, the conversion of the rectangular coordinate system 0-αβ to the polar coordinate 0-rθ can be effected by the use of the following equations.

$$r = \sqrt{(\alpha^2 + \beta^2)} \qquad (1)$$

(I) when 0<α

$$\theta = \tan^{-1}(\beta/\alpha) \quad (2)$$

(II) when $\alpha < 0$ $$\theta = \tan^{-1}(\beta/\alpha) + \pi \quad (3)$$

(III) when $\alpha = 0$, $\beta > 0$ $$\theta = \pi/2 \quad (4)$$

(IV) when $\alpha = 0$, $\beta < 0$ $$\theta = \pi/2 \quad (5)$$

Figure 6:
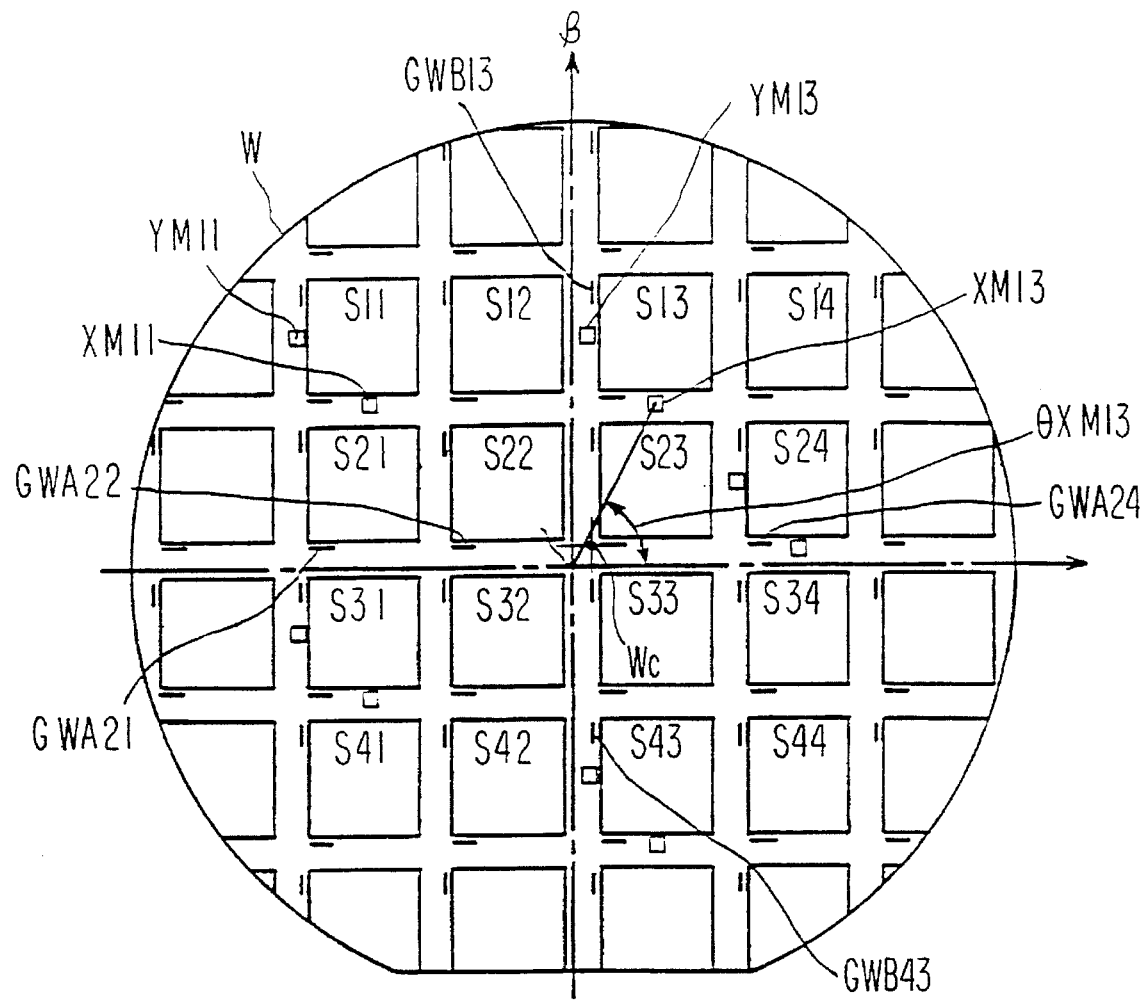
FIG. 6 is a plan view showing the arrangement of the patterns on a wafer to be processed.

To determine the polar coordinate system 0-rθ, the origin of the θ coordinate must be determined. FIG. 6 is a diagram for explaining the method of determining a coordinate system on the wafer W. The α-direction indicating θ=0 is brought into coincidence with the lateral coordinate system on the side of exposed areas $S_{ij}$ printed in a regularly arranged form by the stepper. More specifically, it is determined by the direction in which global alignment marks $GWA_{21}$, $GWA_{22}$, $GWA_{23}$ and $GWA_{24}$ are arranged.

Figure 7:
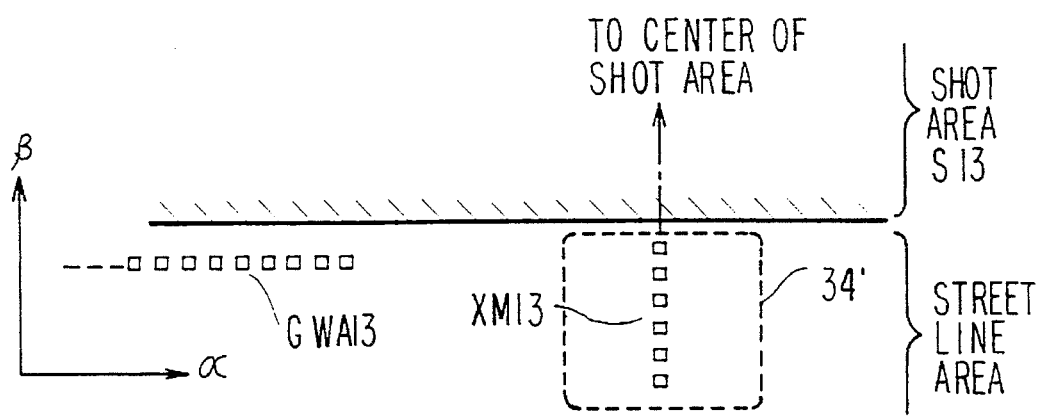
FIG. 7 is a plan view of the wafer showing the arrangement relationship between the alignment marks and the resist removal portion.

FIG. 7 shows a single exposed area (shot area) formed by the stepper and the arrangement of various alignment marks and what are shown here ralate to the shot area $S_{13}$ in FIG. 6. These marks are formed within the street line area (about 100 μm in width) between the shot areas and it is assumed that in FIG. 7 a mark $XM_{13}$ a is detected by for example the alignment system (particularly the TTL type) of the stepper through the projection optical system.

Also, assuming that the marks YM and XM of shot areas $S_{11}$, $S_{24}$, $S_{31}$ and $S_{43}$ are also detected by the TTL method in addition to the shot area $S_{13}$ of FIG. 6, as shown in FIG. 7, the image (34') of the variable aperture 34 of the light irradiation optical system 1 is projected onto the localized portion of the street line including the mark YM or XM, thereby removing (or exposing) the resist layer on this portion.

Further, in the rectangular coordinate system 0-αβ shown in FIG. 6 the α and β axes are each selected parallel to the row of the shot areas and also the origin 0 is the center of rotation of the turn table 7. Therefore, the origin 0 is not necessarily coincident with the central point of the wafer W and there remains eccentricity of about 1 mm even at the most. However, this is dependent on the centering accuracy during the holding by vacuum of the wafer W on the table 7 and it can be reduced to the order of ±10 μm.

Of the above-mentioned global alignment marks $GWA_{ij}$ and $GWB_{ij}$, some (at least three including two marks $GWA_{ij}$ and a single mark $GWB_{ij}$) are detected by the alignment systems shown in FIG. 3 and the detecting circuits YAC and θ AC and the mark position detecting circuit 80 of FIG. 5B.

The operation of the present embodiment will now be described. It is to be noted that in order to determine the criteria for the conversion from the rectangular coordinate system 0-αβ to the polar coordinate system 0-rθ, it is necessary that the relative positional relations between the alignment system shown in FIG. 3 and the light irradiation optical system 1 shown in FIG. 4 are preliminarily known on the basis of the center of rotation 0. Thus, the method for this purpose will be explained first.

Figure 8A:
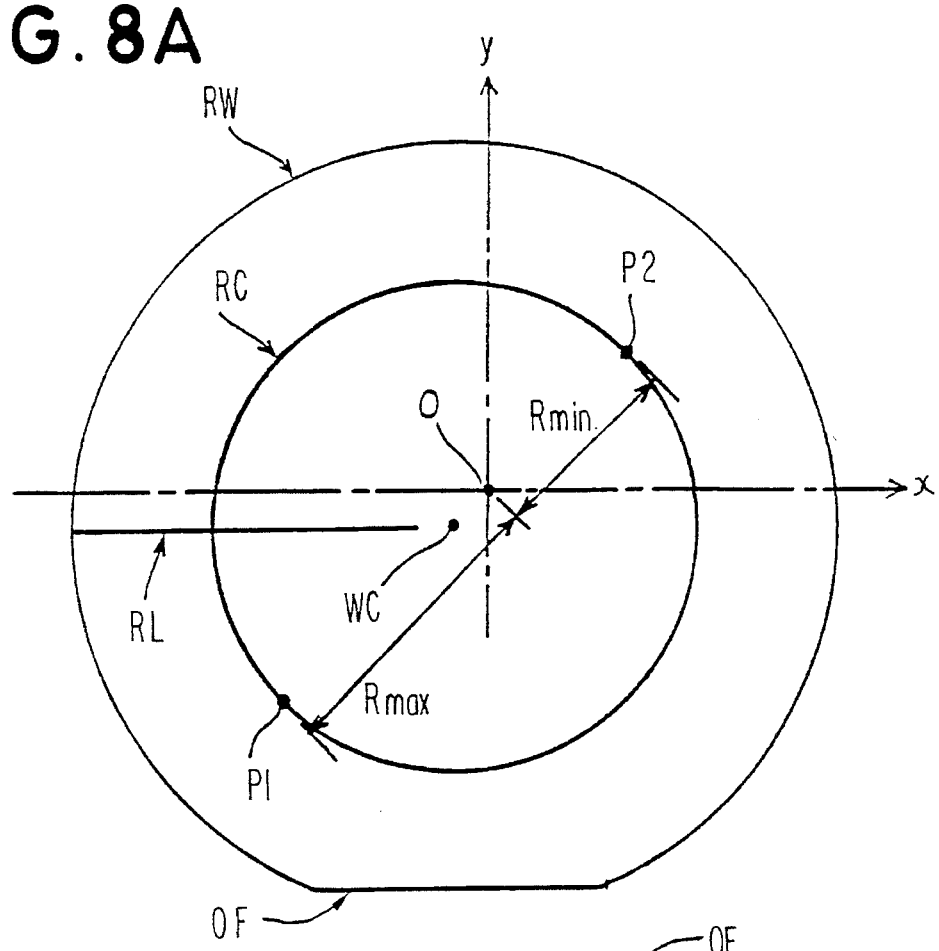
FIGS. 8A and 8B are plan views showing the pattern arrangements of a reference wafer.
Figure 8B:
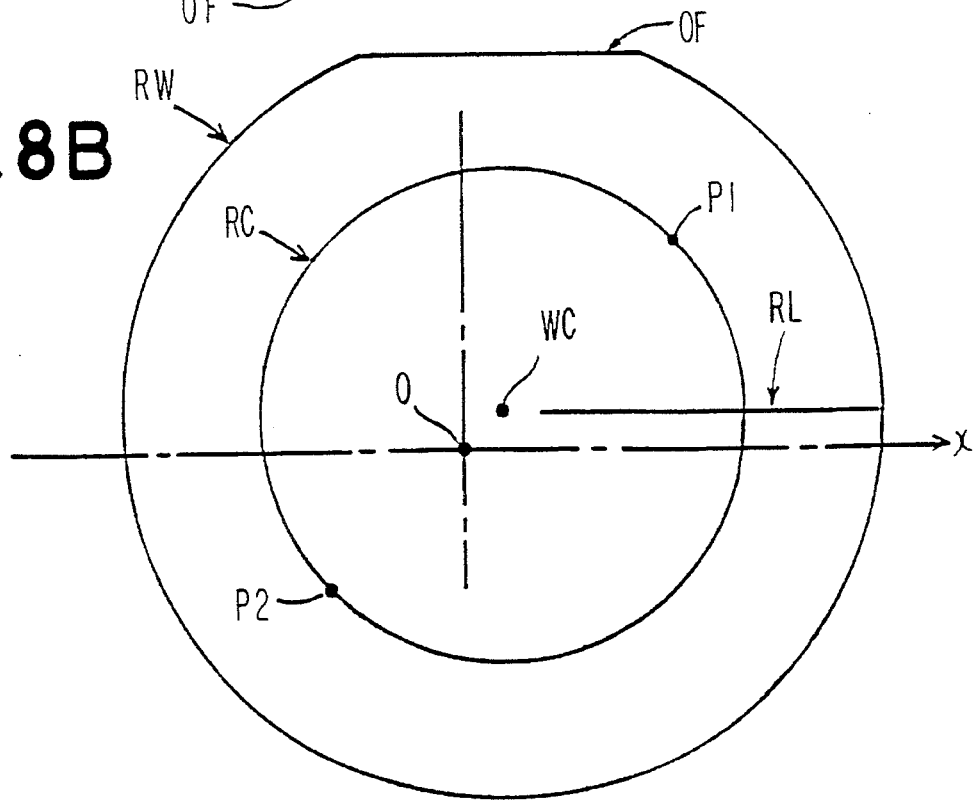

FIGS. 8A and 8B show a reference wafer RW preliminarily prepared for this purpose and marked on the reference wafer RW are a circle RC of a known radius and a straight line RL passing through the center of the wafer in parallel with the orientation flat OF. It is to be noted that FIGS. 8A and 8B are drawn on the assumption that there is eccentricity when the reference wafer RW is held fast by vacuum on the turn table 7, and the center of the wafer RW or the circle RC is shown at $W_c$. Assuming that $P_1$ and $P_2$ represent the points of intersection between the circle RC and the straight line connecting the center $W_c$ and the center of rotation 0 in FIG. 8A, the distance $R_{max}$ from the center of rotation 0 to the point $P_1$ is the amount of outermost eccentricity and the distance $R_{min}$ from the center 0 to the point $P_2$ is the amount of innermost eccentricity. It is to be noted that FIG. 8B shows the condition in which the reference wafer RW has been turned through 180 degrees from the condition of FIG. 8A. Therefore, the amount of eccentricity of the circle RC on the reference wafer RW is $(R_{max} - R_{min})/2$.

Also, it is desirable that the straight line RL on the reference wafer RW is shaped into a diffraction grating form equivalent to the marks $XM_{13}$ and $WA_{13}$ in FIG. 7 so as to be detected by the Y-sensor optical system 2 or the θ-sensor optical system 3.

Figure 9:
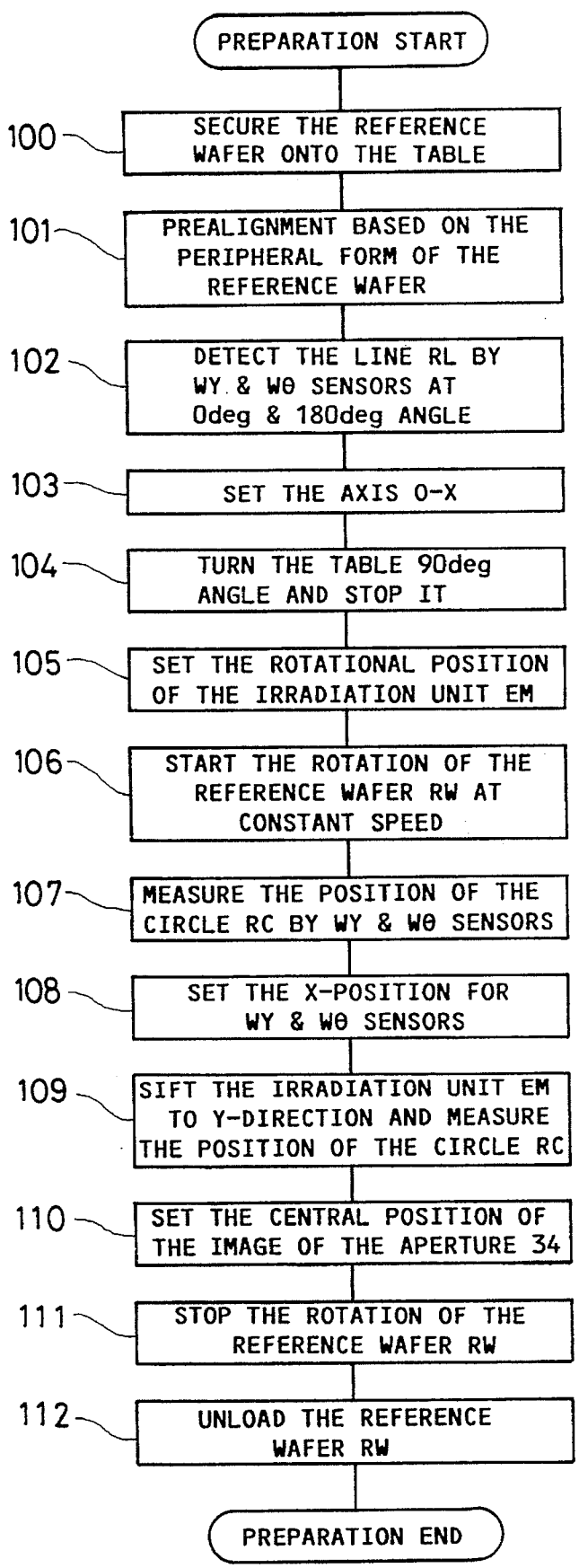
FIG. 9 is a flow chart showing the initializing operation using the reference wafer.

Referring now to FIG. 9, there is illustrated a flow chart showing the position setting procedure of the wafer alignment system, showing the required processing steps performed by using the reference wafer RW of FIGS. 8A and 8B. In FIG. 9, the setting operation is performed in accordance with the following steps by using the reference wafer RW.

Step 100: The loader/unloader 54 places the reference wafer RW on the wafer holder of the turn table 7 and the rotating shaft controller 52 secures the reference wafer RW onto the wafer holder by means of vacuum.

Step 101: The rotating shaft controller 52 rotates the turn table 7 and the wafer peripheral form detection block 53 (the edge sensor 70 and the wafer peripheral form measuring unit 71 of FIG. 5B) measures the position of the peripheral form of the reference wafer RW, thus prealigning the reference wafer RW with the rotating shaft 8 and thereby arranging its flat OF to be substantially parallel to the x-axis as shown in FIG. 8A.

Step 102: The line RL is detected by the Y-sensor WY and the θ-sensor Wθ. When detecting, the rotating shaft 8 is stopped at each of its angular positions attained by two precise 180-degree turns so as to scan the Y-sensor WY or the θ-sensor Wθ in the y-direction to detect the position of the line RL. In the condition of FIG. 8A, the Y-sensor WY, the Y-mark detecting circuit YAC and the position detecting circuit 80 are brought into operation and a y-coordinate value Ya produced upon coincidence of the beam spot of the Y-sensor WY with the straight line RL is sent to the CPU 51. Then, after the rotating shaft 8 has been rotated precisely through 180 degrees through the motor drive circuit 72 in response to a command from the CPU 51 thereby setting the shaft 8 in the condition of FIG. 8B, the θ-sensor Wθ, the θ-mark detecting circuit θ AC and the position detecting circuit 80 are brought into operation thereby obtaining a y-coordinate value Yb upon coincidence of the beam spot of the θ-sensor W θ with the straight line RL.

Step 103: The CPU 51 calculates $(Y_a + Y_b)/2 = Y_{set}$ in accordance with the previously obtained y-coordinate values $Y_a$ and $Y_b$ and the detection centers (laser spots) of the Y-sensor WY and the θ-sensor Wθ are simultaneously moved in the y-direction in such a manner that the y-direction measured position value of the position sensor 84 becomes $Y_{set}$. When these movements have been completed, the lines passing through the detection centers of the Y-sensor WY and the θ-sensor Wθ, respectively, coincide with the x-axes passing through the centers of rotation 0 in FIGS. 8A and 8B, respectively.

Step 104: Then, the rotating shaft 8 is precisely rotated only through 90 degrees from the condition attained at the step 103 so that the straight line RL is observed by the imaging device 46 of the light irradiation optical system 1.

Step 105: In accordance with the results of the measurements of the imaging device 46 and the image processing circuit 88, the CPU 51 determines the amount of deviation in the x direction (the tangential direction of the circle RC) between the center of the light irradiation unit EM (the center of the image 34' of the variable aperture 34) and the straight line RL, and the light irradiation unit EM (or the whole light irradiation optical system 1) is moved and positioned in the x direction in such a manner that the amount of deviation is reduced to zero.

Step 106: The reference wafer RW is rotated at a constant speed by the motor 9.

Step 107: The circle RC is measured by the Y-sensor WY and the θ-sensor Wθ while rotating the reference wafer RW at the constant speed. In this case, the measurement results in the detection of the reciprocating oscillations in the x direction of the intersections of the circle RC with the x-axis (FIG. 8) due to the eccentricity. The Y-sensor WY detects the circle RC on the left side of the center of rotation 0 on the x-axis in FIG. 8. At this time, the Y-sensor WY detects the point $P_1$ on the circle RC as the outermost position (the distance from the center 0) $R_{max}$ and the point $P_2$ as the innermost position (the distance from the center 0) $R_{min}$ in accordance with the measured value $X_2$ of the position sensor 84. On the other hand, the θ-sensor Wθ detects the circle RC on the right side of the center 0 on the x-axis and similarly it detects the outermost position and the innermost position in accordance with the measured value $X_3$ of the position sensor 84. However, when the Y-sensor WY detects the outermost position (the point $P_1$), the θ-sensor Wθ detects the innermost position (the point $P_2$). It is to be noted that during this operation the Y-sensor WY and the θ-sensor Wθ may be moved in the x direction to search the circle RC.

Step 108: Then, in accordance with the computation of $(R_{max}+R_{min})/2=R_{ref}$, the CPU 51 determines the x-direction positions of the Y-sensor WY and the θ-sensor Wθ which would be set if the circle RC were not eccentric. This computed value $R_{ref}$ corresponds to the radius of the circle RC from the wafer center $W_c$. Then, the CPU 51 positions the Y-sensor WY and the θ-sensor Wθ in the x direction in such a manner that the measured values $X_2$ and $X_3$ of the position sensor 84 become equal to the computed value $R_{ref}$. At this time, the center position of the light irradiation unit EM set by the previous step 105 is corrected in position by an amount corresponding to $Y_{set}$ in the x direction. Thus, the center of the image 34' projected by the light irradiation unit EM is positioned on the y-axis in FIG. 8. After this setting has been completed, the movement of the light irradiator EM in the x direction is inhibited until the time of the next apparatus calibration.

Step 109: Then, the CPU 51 moves the light irradiation unit EM (or the whole light irradiation optical system 1) in the y direction through the driving motor 86 and the position sensor 85 thereby setting in such a manner that the rotating circle RC is observed by the imaging device 46 and the distance $R_{max}$ of the point $P_1$ and the distance $R_{min}$ of the point $P_2$ on the circle RC are measured in accordance with the detection results of the position sensor 85 and the image processing circuit 88 as in the case of the preceding steps 107 and 108.

Step 110: The CPU 51 similarly computes $(R_{max}+R_{min})/2 = R_{ref}$ and controls the driving motor 86 in such a manner that the measured value of the position sensor 85 (the measured value of the distance from the center 0) coincides with the computed value $R_{ref}$, thereby presetting the center position of the image 34' of the light irradiation unit EM.

Step 111: The rotation of the reference wafer RW by the turn table 7 is stopped.

Step 112: The reference wafer RW is unloaded from the wafer chuck of the table 7 by the loader/unloader 54.

As the result of the procedure according to the above-mentioned steps, both of the alignment system (the Y-sensor WY and the θ-sensor Wθ) and the light irradiation unit EM (the image 34')are set with respect to the polar coordinate system 0-rθ whose origin is the center of rotation 0.

Thereafter, during the processing of the actual wafer W, the y-direction reference position $Y_{set}$ and the x-direction reference position (distance) $R_{ref}$ of the alignment system and the y-direction reference position (distance) $R_{ref}$ of the processing center of the light irradiation unit EM, which were determined in the above-mentioned procedure, are used as references for all the cases.

It is to be noted that while, in the detection of the circle RC by the Y-sensor WY and the θ-sensor Wθ at the previous step 107, the detectors 24Y and 24θ and the mark detecting circuits YAC and θAC shown in FIGS. 3 and 5 may be used, in this case the directions of measurement by the beam spots and the direction of the circle RC to be measured (the x-axis direction) must coincide with each other. Therefore, if it is difficult to do so from the standpoint of the alignment sensor construction, the circle RC may be detected by the use of the imaging devices 29Y and 29θ and the image processing circuit 88.

Figure 10A:
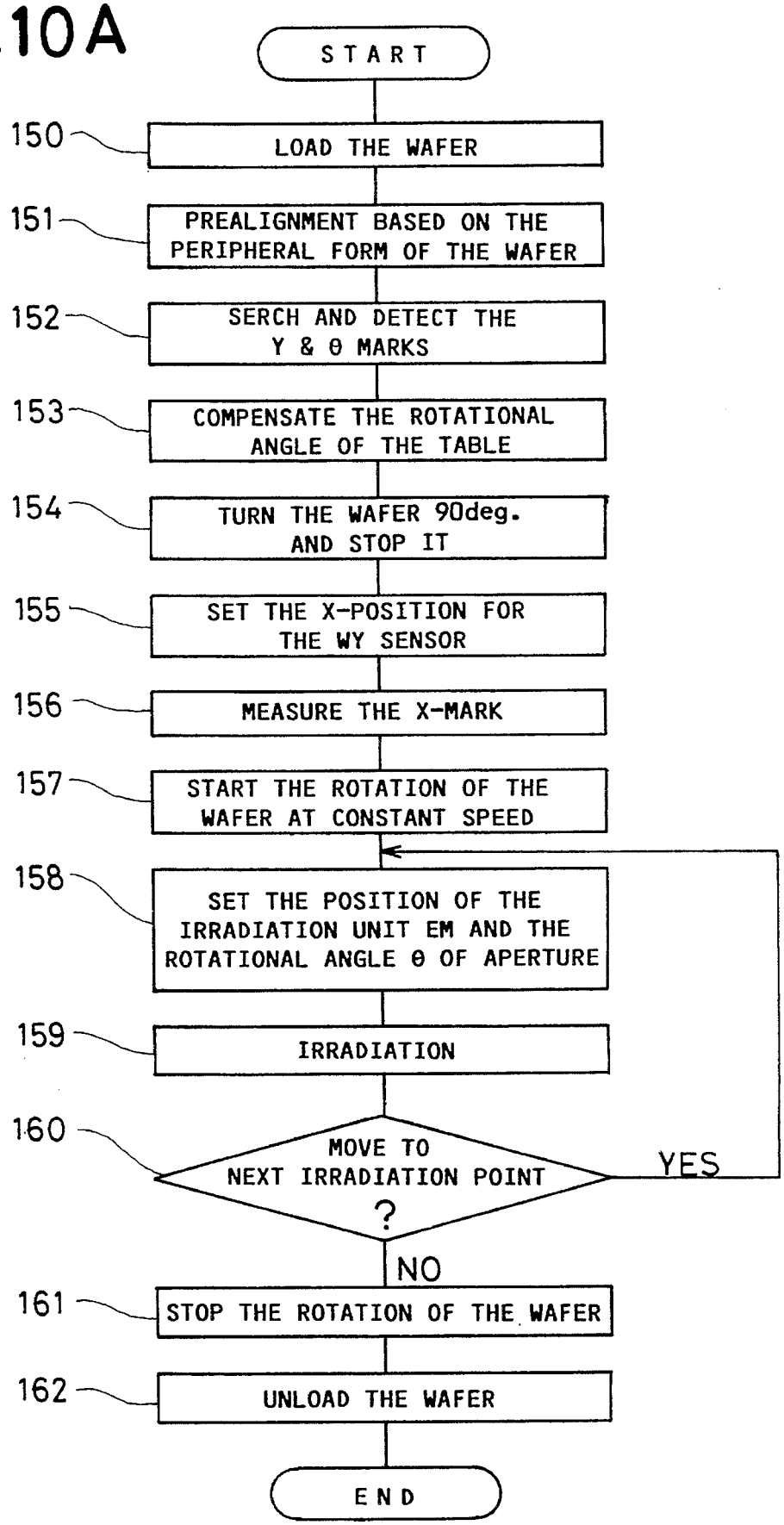
FIG. 10A is a flow chart showing the alignment operation of a wafer to be processed and the resist removing light irradiation operation.

Next, the procedure of removing the resist on the actual wafer W will be explained with reference to the flow chart of FIG. 10A.

As shown in FIG. 6, the wafer W is formed with global alignment marks $GWA_{ij}$ and $GWB_{ij}$ provided for the respective shot areas $S_{ij}$ and also x marks $XM_{ij}$ and x marks $YM_{ij}$ are provided for the respective shot areas $S_{ij}$. The positional relations of these marks are preliminarily determined at the time of exposure by the stepper and the CPU 51 receives these positional information from the design data unit 81 to hold them. Also, the x positions of the Y-sensor WY and the θ-sensor Wθ are pleriminarily determined in such a manner that the marks $GWA_{ij}$ at two locations can be measured simultaneously in accordance with the positional relations of the global alignment marks $GWA_{ij}$ and $GWB_{ij}$ and the beam spots of the sensors WY and Wθ are set at these positions. After this preparation has been completed, the processing shown by the flow chart of FIG. 10A including steps 150 to 162 is started.

Step 150: The wafer W is centered through the operation of the loader/unloader 54 and in this condition the wafer W is placed on the wafer holder of the turn table 7 so as to be secured by vacuum.

Step 151: The wafer W is rotated through the control of the rotating shaft controller 52 and the prealignment of the wafer W with the rotating shaft 8 is effected by the action of the peripheral form detection block 53 on the basis of the peripheral form of the wafer W. In other words, the positioning of the rotating shaft 8 is effected in a manner that the flat OF (the α-axis of the shot arrangment) substantially coincides with the x-axis.

Step 152: While scanning the Y-sensor WY and the θ-sensor Wθ in the y direction from the reference position $Y_{set}$, y coordinates $Y_{g21}$ and $Y_{g24}$ of the global alignment marks $GWA_{21}$ and $GWA_{24}$ are respectively detected by the sensors.

Step 153: The CPU 51 determines the rotational error $\Delta\theta_g$ from the difference between the y coordinate values $Y_{g21}$ and $Y_{g24}$ and the driving motor 9 of the turn table 7 is operated minutely so as to reduce the error $\Delta\theta_g$ to zero.

When this occurs, the α-axis of the shot arrangement coordinate system on the wafer W is made parallel to the x-axis and the CPU 51 resets the angle information DSθ of the rotational angle detection counter 73 to zero. After the rotational angle of the turn table 7 has been compensated, the Y-sensor WY and the θ-sensor Wθ are again scanned in the y direction so that the identity in y-direction position between the global marks $GWA_{21}$ and $GWA_{24}$ is confirmed through the mark detecting circuits YAC and θ AC, etc., and a y-direction position $Y_{wa}$ permitting the detection of the mark $GWA_{21}$ by the Y-sensor WY and the simultaneous detection of the mark $GWA_{24}$ by the θ-sensor Wθ is determined in response to the position sensor 84. The CPU 51 calculates and stores the difference between the position $Y_{wa}$ and the reference position $Y_{set}$ as the amount of eccentricity Δβw in the β direction between the wafer center $W_c$ and the center of rotation 0 shown in FIG. 6. It is to be noted that if it is necessary, the turn table 7 is moved vertically to effect the focusing during the detection of the global marks at the above-mentioned steps.

Step 154: Then, the CPU 51 rotates the wafer W through only 90 degrees precisely through the turn table 7 and stops it.

Step 155: The x position (the distance from the center 0) of the Y sensor WY is changed thereby making it possible to detect the global alignment mark $GWB_{22}$.

Step 156: The Y-sensor WY is scanned in the M direction so that a y-direction position $Y_{wb}$ of the global alignment mark $GWB_{22}$ is measured and the difference between it and the reference position $Y_{set}$ is determined thus determining the difference between it and the wafer center $W_c$ and thereby calculating the amount of eccentricity $\Delta\alpha_w$ between the wafer center $W_c$ and the center of rotation 0 in the α direction. As the result of these operations, it is now possible to designate the pattern position on the wafer W by the polar coordinate system 0-rθ.

Step 157: The wafer W is rotated at the constant speed by the turn table 7. At this time, it is assumed that the counter 73 is reset to zero in response to each 360-degree turn from the position at which it is reset to zero.

Step 158: The position of the light irradiation unit EM is set to a position r which is to be irradiated by light and the size (the sides a and b) of the variable aperture 34 is set. Also, the rotational angle of the variable aperture 34 is set in correspondence to the value of θ on the 0-rθ coordinate system. These settings are effected by the design data unit 81, the coordinate transformation ALU 82, the CPU 51, the drive circuit 83, the motor 86, etc.

Step 159: At the position 0-rθ where the alignment marks $XM_{ij}$ and $YM_{ij}$ are brought below the light irradiation unit EM, the irradiation of the laser light in a predetermined quantity or in an amount suitable for the stripping of the resist is made through the synchronizing circuit 87.

Step 160: A return is made to the step 158 if there is any other remaining irradiation point.

Step 161: If there is no remaining irradiation point, the rotation of the wafer is stopped.

Step 162: The wafer W is unloaded from the table 7.

Of the foregoing operations, the steps 158 and 159 will now be described in greater detail with reference to FIGS. 10B and 10C.

Figure 10B:
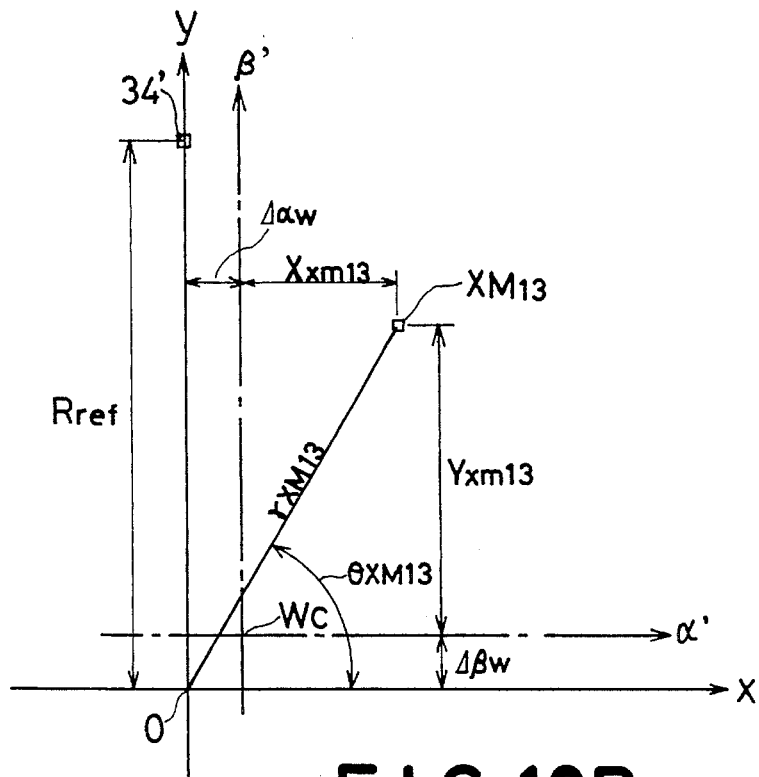
FIGS. 10B and 10C are diagrams for explaining in detail the manner in which a rectangular coordinate system is converted to a polar coordinate system.

FIG. 10B shows the arrangement of the respective coordinate systems immediately following the completion of the alignment at the step 156, and the rectangular coordinate system α'β' whose origin is the wafer center $W_c$ is set to be parallel to the coordinate system αβ in FIG. 6. Further, it is set so that the global marks $GWA_{21}$, $GWA_{22}$, $GWA_{24}$, etc., are positioned on the α'-axis and it is also set so that the global marks $GWB_{13}$, $GWB_{43}$, etc., are positioned on the β'-axis. The designed data unit 81 of FIG. 5B stores the positional coordinates of the marks $XM_{ij}$ and $YM_{ij}$ requiring the resist removal on the basis of the wafer center $W_c$. For instance, the mark $XM_{13}$ is stored as coordinate values $(X_{xm13}, Y_{xm13})$ as shown in FIG. 10B. At the time of the completion of the step 156, the coordinate system αβ is in coincidence with the coordinate system xy and in this condition the amounts of eccentricity $(\Delta\alpha_w, \Delta\beta_w)$ between the center of rotation 0 and the wafer $W_c$ are determined.

Also, the image 34' of the variable aperture 34 in the light irradiation optical system 1 is at the position of the distance $R_{ref}$ from the center of rotation 0.

In this case, the coordinate transformation unit 82 of FIG. 5 receives the design coordinates $(X_{xm13}, Y_{xm13})$ of the mark $XM_{13}$ and the amounts of eccentricity $(\Delta\alpha_w, \Delta\beta_w)$ and calculates the distance $rXM_{13}$ from the center of rotation 0 to the center of the mark $XM_{13}$ as shown by the following equation by utilizing the previously mentioned equation (1).

$$rXM_{13} = \sqrt{\{(X_{xm13} + \Delta\alpha_w)^2 + (Y_{xm13} + \Delta\beta_w)^2\}} \quad (6)$$

Also, since the mark $XM_{13}$ is positioned on the positive side of the α'-axis on the coordinate system α'β', the previously mentioned equation (2) is applicable and the angle $\theta XM_{13}$ formed by the α'-axis (or the α-axis) and the segment of the radius $rXM_{13}$ is calculated from the following equation.

$$\theta XM_{13} = \tan^{-1}\{(Y_{xm13} + \Delta\beta_w)/(X_{xm13} + \Delta\alpha_w)\} \quad (7)$$

Then, the CPU 51 converts the angle θ $XM_{13}$ to the corresponding rotational angular position of the turn table 7. In the present embodiment, the measured value DSθ of the counter 73 is set to zero when the processing point (the image 34') is positioned on the y-axis and the α'-axis of the arrangement coordinate system is parallel to the x-axis as shown in FIG. 10B. As a result, the rotational angle θ $XM_{13}'$ of the turn table 7 up to the time of the positioning of the mark $XM_{13}$ on the y-axis is given for example by the following equation in accordance with the existing quadrant of the mark $XM_{13}$ within the coordinate system αβ

$$\theta XM_{13}' = \pi/2 - \theta XM_{13}$$

Figure 10C:
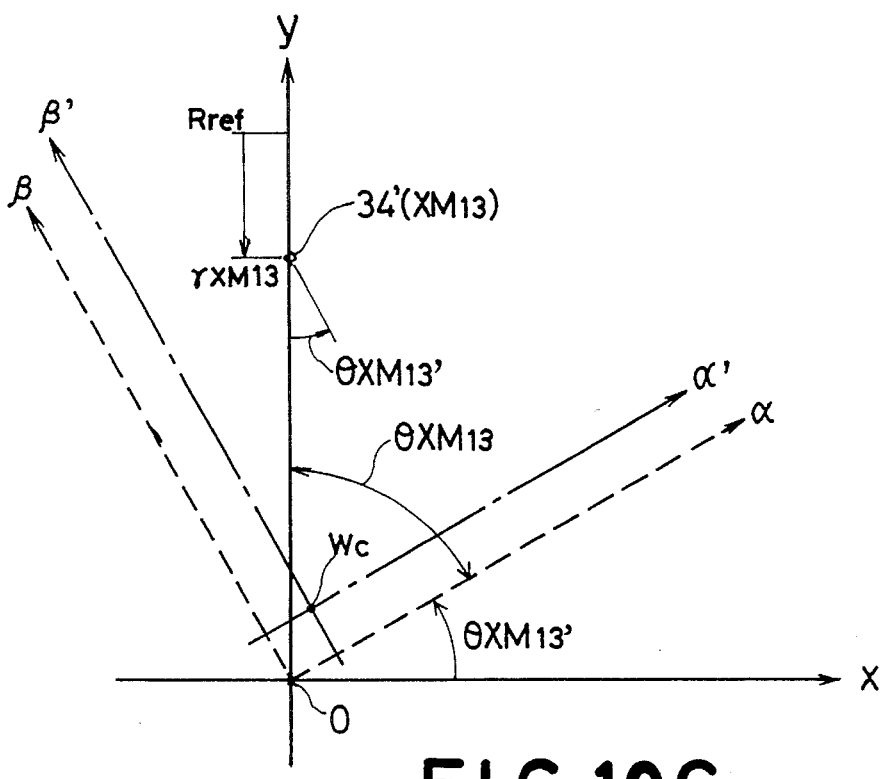

FIG. 10C shows a condition in which the turn table 7 is rotated counterclockwise by the angle θ $XM_{13}'$, and the center of the image 34' by the light irradiation unit EM is brought into coincidence with the center of the mark $XM_{13}$ by moving the position of the image 34' to the position of the distance $rXM_{13}$.

In this condition, however, the form of the image 34' is rotated relative to the form of the resist removing area, and so the CPU 51 applies a command to the drive circuit 83 in such a manner that the variable aperture 34 is rotated counterclockwise by the angle θ $XM_{13}'$.

After the radial position setting of the image 34', the setting of the direction of rotation of the image 34' and the calculation of the angle θ $XM_{13}'$ have been completed, the CPU 51 applies the value of the angle θ $XM_{13}'$ to the trigger synchronizing circuit 87. Each time this value coincides with the measured value DSθ $XM_{13}$ of the counter 73 (for every rotation), the synchronizing circuit 87 sends a single-pulse trigger signal to the processing laser light source 31.

Usually, when removing the resist by an excimer laser or the like, it is difficult to clearly remove the resist with one pulse of a high beam power and a plurality of pulses are required. Thus, each time the laser light source 31 oscillates, the output of the photoelectric detector 41 in FIG. 4 is monitored so that the removal of the resist is confirmed in accordance with the presence of the tendency caused by the absorption of ultraviolet rays by the resist in a real time manner.

Note that the CPU 51 preliminarily calculates the polar coordinate values (r, θ) of the marks $XM_{ij}$ and $YM_{ij}$ requiring the resist removal and the order of processing is determined for example in such a manner that the mark having the radius r positioned on the outermost side is processed first and the mark having the radius r positioned on the innermost side is processed last. By so doing, the movement of the light irradiation unit EM (the image 34')on the y-axis is limited only to the movement in one direction toward the center of rotation 0 from the outer side (or in the reverse direction) and the throughput is improved as compared with cases where the processing points are transferred from one to another randomly.

While, in the above-described embodiment, the Y-sensor WY, the θ-sensor Wθ and the light irradiation unit EM are provided as separate units, by modifying the construction of the optical system, the three units can be combined in one unit or in two units. Although the light irradiation unit EM is provided at one place only, it is possible to provide a plurality of ligh irradiation units EM which are operable independently of each other thereby improving the throughput.

Also, the peripheral form detection block 53 can be replaced with a mechanical positioning unit in cases where the positioning is effected by mechanical contacting in accordance with a peripheral form standard.

The above-mentioned embodiment has a feature that since the resist is removed while rotating the wafer W, even if any splinters are caused, the splinters are thrown to the outside of the wafer W by the centrifugal force and the splinters are not left on the surface of the wafer W.

As auxiliary means required for maintaining such cleanliness, it is conceivable to provide means for flowing such gaseous body as clear air, nitrogen, oxygen or ozone from above the center of rotation 0, thereby flowing the gaseous body from the center toward the outer diameter.

In order to ensure greater cleanliness, it is conceivable to effect the cleaning by flowing such fluid as pure water from above the center of rotation. In the case of a positive resist, there are cases where the developing solution may be used in place of pure water.

While, in the above-described embodiment, the resist is stripped by means of a pulse-type laser light utilizing a thermal or photochemical reaction, in the case of a positive resist the objective can be attained by using a CW light (continuously emitted light) which sensitizes the resist, e.g., a mercury lamp light source or He-Cd laser. In this case, the turn table 7 of this embodiment is concurrently used as a turn table for the coater/developer and it is desirable that the rotation of the wafer W is stopped at a calculated angular position during the irradiation of the light. This type of coater/developer is disclosed for example in U.S. Pat. No. 4,900,939. Since the resist and the developing solution splash in the vicinity of the turn table of the coater/developer thus giving rise to the posibility of contaminating the optical systems, a protective transparent flat sheet is disposed between the alignment sensors and the light irradiation unit so that if any contamination is caused, it is necessary to clean only the flat sheet. As regards the cleaning of the flat sheet, a nozzle for discharging a cleaning fluid may be provided so as to effect a remote control automatically.

Where the resist on the alignment marks are removed in succession to the operation of the coater, the alignment measurement accuracy can be easily improved by performing the aligning operation using the alignment marks on the wafer prior to the resist application.

Where the resist is removed and the mark positions are measured while rotating the wafer W, in order to permit the observation of an image, it is only necessary to use a pulse-type light source as a light source for image observing purposes and cause the light source to emit light in synchronism with the rotation of the wafer W.

Where it is constructed so that a cleaning fluid or developing solution is fed onto the wafer W, if the thickness of the layer of such fluid on the resist is less than the allowable variation values, the resist can be removed while flowing the fluid.

Where the light is irradiated while rotating the wafer W, there is the possibility of shifting the position of the wafer W relative to the holder 7 due to the high speed rotation and in such case it is desirable that after the high speed rotation has been effected, the rotational speed is reduced or stopped and the alignment mark positions are again confirmed. Further, in the case of a substrate such that a wafer W is caused to elongate due to the centrifugal force, the amount of elongation should preferably be subjected to scaling compensation.

After the resist has been removed, if necessary, it is possible to confirm whether the resist of the proper positions has been removed by use of the image observing system.

If the resist has been removed from other than the selected places by any chance, in the case of the negative resist the operation can be started all over again by first removing the resist on the whole surface of the wafer and then applying the resist again. Where the spinner is used in common with the coater/developer, these operations can be completed while mounting the wafer on the same spinner. In the case of the positive resist, a sensitizing light can be irradiated over the whole wafer surface and then the resist can be removed by use of the developing solution.

A second embodiment of the present invention will now be described.

In accordance with the second embodiment, in the resist removal effected by locally irradiating a high energy beam onto the resist layer applied onto a wafer and thereby removing the resist on the desired localized portions, a contamination preventive film is preliminarily applied to the surface of the resist layer whereby a high energy beam is irradiated from above the contamination preventive film thereby removing both of the contanination preventive film and the resist layer on the localized portions and then the contamination preventive film on the remaining resist layer is removed.

Figure 11A:
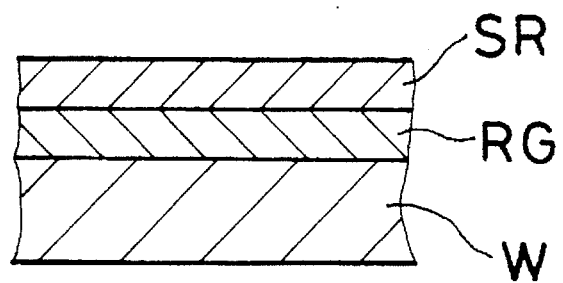
FIGS. 11A, 11B and 11C are sectional views showing the sequence of the basic operations of a thin film removing method according to a second embodiment of the present invention.
Figure 11B:
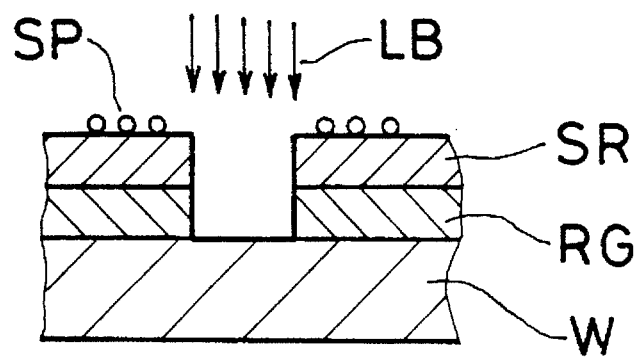
Figure 11C:
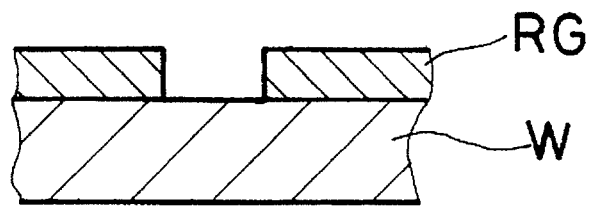

The processing steps of a thin film removing method according to the second embodiment will be first described briefly with reference to FIGS. 11A to 11C. According to this method, as shown in FIG. 11A, a contamination preventive film SR is additionally applied to the surface of a resist layer RG on a wafer W prior to the irradiation of a high energy beam LB. At this time, the contamination preventive film may be uniformly applied to the whole surface of the resist layer RG or it may be applied to only given extent centering the resist removal areas where the contamination is expected as the case may be.

Then, as shown in FIG. 11B, the high energy beam LB is irradiated on the removal area of the resist layer RG thereby removing both of the resist layer RG and the contamination preventive film SR. At this time, the bond of its molecules is broken by the photo energy to scatter in the form of fine particles SP and a part of these fine particles are oxidized to form such volatile substances as $CO_2$ and $H_2O$. However, a large part of the removed resist is scattered in the form of the fine particles SP to the surroundings and deposited on the contamination preventive film SR.

Thereafter, as shown in FIG. 11C, the contamination preventive film SR is physically stripped and removed from the surface of the resist layer RG or it is dissolved and removed by an etching solution, thereby completing the present processing.

In the dissolving removal of the contamination preventive film SR, if, for example, a positive resist of the type whose light-impinged portion becomes soluble is used as the resist layer RG, it is possible to use as the contamination preventive film SR a negative resist of the type whose light-impinged portion undergoes a crosslinking reaction to become unsoluble to solvents so that prior to the exposure only the negative resist is dissolved into the developing solution, thus making it possible to remove only the contamination preventive film SR by immersing it in the developing solution.

Other suitable materials for use as a contamination preventive film for the positive resist layer RG include ARC (the tradename of Brewer Science Co.) which is generally used for the purpose of reducing the generation of standing waves, BC5 (the tradename of General Electric Co.) which is used as a layer separating film for cells and the like. The ARC can be dissolved and removed by the resist developing solution if it has been prebaked and it can be dissolved and removed with pure water if it has not been prebaked. The BC5 can be dissolved and removed with an alkaline developing solution. Where a coater/developer which will be described later is used for systematization, in consideration of the intended reduction in running cost, it is preferable to use a contamination preventive film which can be dissolved and removed by utilizing the conventional resist developing operation or the resist application preliminary operation (particularly the cleaning operation) (e.g., a contamination preventive film which can be stripped by use of the resist developing solution or pure water).

Where a negative resist, particularly a negative resist of the organic solvent developing type is used as the resist layer RG, it is possible to use the BC5 as a contamination preventive film so that only the BC5 can be removed by an alkaline developing solution. Alternatively, it is preferable to use the XP-8843 (tradename of Shipley Co.) of the alkaline developing type as a contamination preventive film and also it is desirable to use as a contamination preventive film the previously mentioned ARC without pre-baking. Without being pre-baked, the ARC can be dissolved and removed by a pure water rinse (spin wash) for about 2 minutes and thereafter it is only necessary to effect the drying by a so-called spin dry. In addition, if a material which is higher in etching rate than the resist of the resist layer RG is used as a contamination preventive film SR, by suitably setting the etching time, it is possible to completely remove only the contamination preventive film SR thereby causing the resist layer RG to remain on the wafer W as shown in FIG. 11C.

Figure 12:
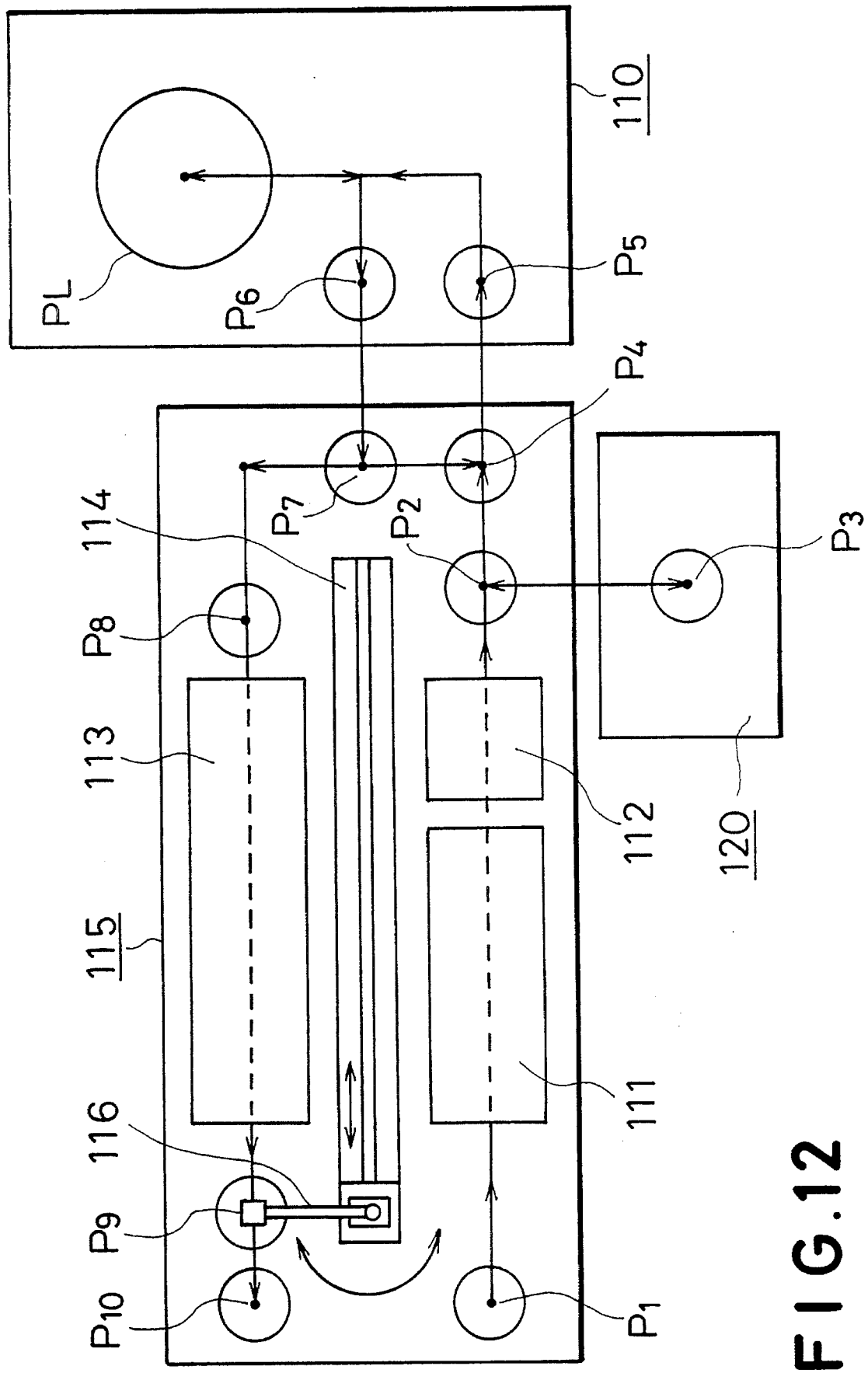
FIG. 12 is a schematic plan view of a lithographic system well suited for performing the method of the second embodiment.

Referring now to FIG. 12, a lithography system well suitable for the performance of the method according to the present embodiment will be described.

FIG. 12 is a schematic plan view showing the manner in which a reduction projection exposure apparatus (hereinafter referred to as a stepper) proper 110 used with lithographic process in the semiconductor device manufacture, a coater/developer (a unit combining together a resist coater and a developer) 115 and a resist removing apparatus 120 of the previously mentioned type are connected in an in-line manner, and the coater/developer 115 is improved so as to perform the method of the present embodiment efficiently.

The wafer to be exposed is first mounted at a position $P_1$ of the coater/developer 115, coated with a resist (a positive resist in this embodiment) in a resist coating and drying unit 111 and then coated with a contamination preventive film on the resist in a contamination preventive film coating unit 112 (the drying is effected if occasion demands). In this condition, the wafer is left to wait at a buffer position $P_2$.

In synchronism with the operation of the resist removing apparatus 120 (will be described in detail later), the wafer is transferred from the buffer position $P_2$ onto a processing position $P_3$ on the stage of the resist removing apparatus 120. At this time, the wafer which is free of the resist and the contamination preventive film on the given areas including alignment marks (which will be described later) is returned to the position $P_2$. Then, it is sent to a developing unit 113 through branch positions $P_4$ and $P_7$ and a position $P_8$. For instance, where a negative resist is used as the contamination preventive film, the developing process of the resist dissolves and removes only the contamination preventive film.

It is to be noted that the coater/developer 115 of the present embodiment is particularly improved in the following respects that a linear guide rail 114 is arranged between the resist coating unit 111 and the developing unit 113 and a transfer arm 116 is arranged so as to move one-dimensionally along the guide rail 114 while holding the wafer. The arm 116 is constructed so that it is capable of vertical and rotary movements whereby the wafer emerging from the developing unit 113 is held at a position $P_9$ and lifted by a given amount, moved along the guide rail 114 to the right in FIG. 12 and transferred to the branch position $P_7$. Then, the wafer is transferred from the position $P_7$ to the position $P_4$ where it is left to wait.

It is to be noted that the wafer which has been transferred from the resist removing apparatus 120 and waiting at the buffer position $P_2$ may be directly transferred to the developing unit 113 by the arm 116.

When the exposure operation is started by the stepper 110, the wafer is transferred from the position $P_4$ to a load position $P_5$ of the stepper 110 so that the wafer is transferred onto the wafer stage and the exposure is effected. After the exposure has been effected, the wafer is removed from the stage, transferred again to the branch position $P_7$ of the coater/developer 115 through an unload position $P_6$ and sent to the developing unit 113 through the position $P_8$. After the developing of the resist has been completed, the wafer is held at a take-out position $P_{10}$ through a position $P_9$ of the coater/developer 115.

By assembling an in-line system by using the coater/developer 115 provided with the transfer arm 116 which is vertically movable and rotatable as mentioned previously, it is possible to efficiently remove the contamination preventive film by means of the conventional resist developing unit and the resist on the desired areas can be removed without considerably deteriorating the throughput.

Further, in accordance with the system shown in FIG. 12, not only the processing is performed in the above-mentioned order but also, as for example, the developed wafer may be directly returned to the stepper 110 so as to effect the observation of the resist image and various measurements by the use of the alignment system of the stepper. Of course, if the resist removal is not needed, the wafer which has been coated with a resist and dried can be transferred as such to the stepper 110 and exposed as previously.

Figure 13:
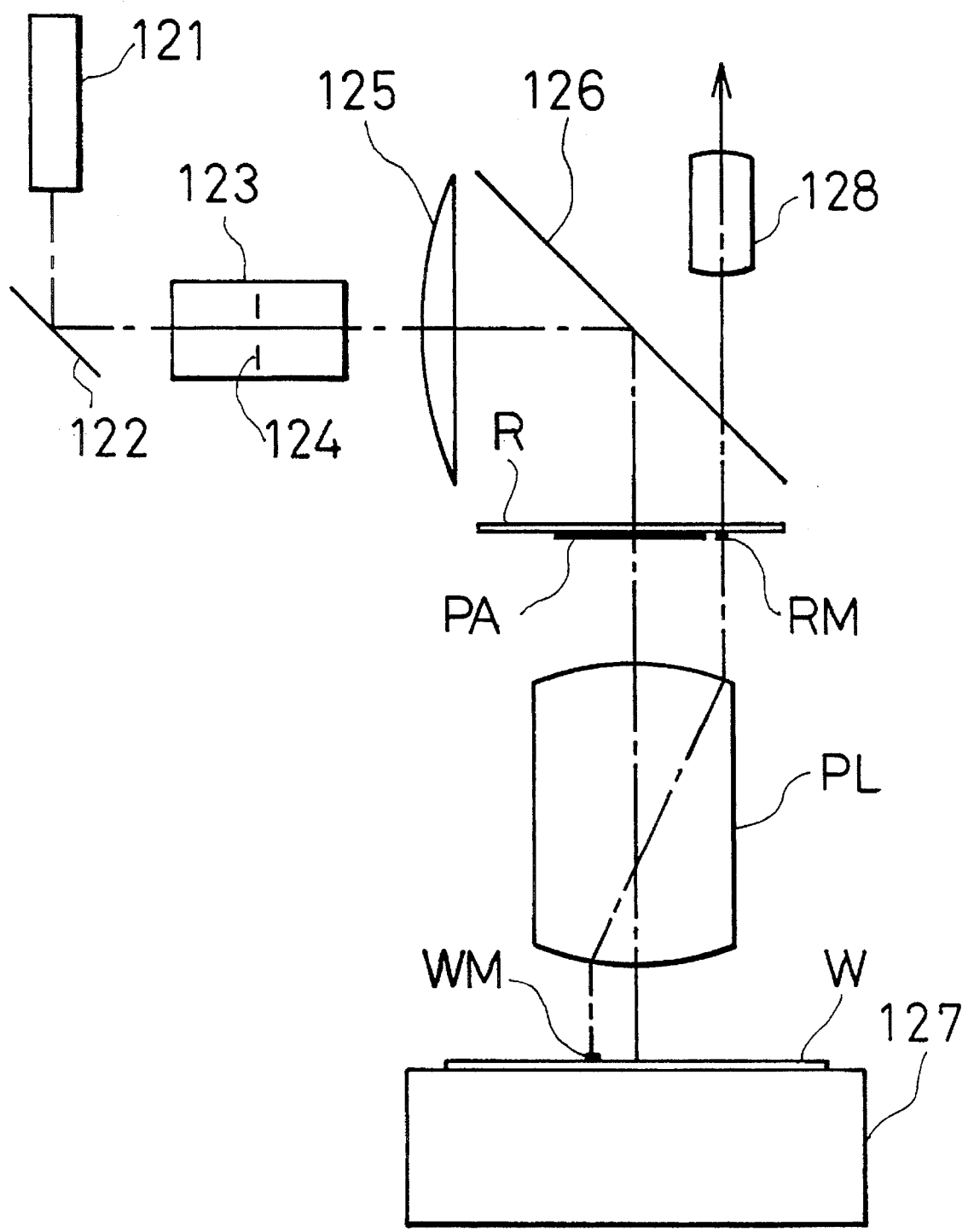
FIG. 13 is a schematic diagram showing an exemplary construction of the exposure apparatus in the system shown in FIG. 12.

Referring now to FIG. 13, there is illustrated an example of the exposure apparatus (the stepper 110) used in the system shown in FIG. 12. As the exposure apparatus used in the present embodiment, the conventional apparatus (the exposure apparatus disclosed in Japanese Laid-Open Patent Application No. 63-283129 corresponding to U.S. application Ser. No. 192,784 filed on May 10, 1988) can be utilized as such.

In the Figure, an illuminating light source 121 comprising an ultra high pressure mercury lamp or the like produces an illuminating light of a wavelength (exposure wavelength) which sensitizes the resist layer, e.g., a g-line or i-line and this illuminating light enters an illuminating optical system 123 including a variable blind 124, an optical integrator (fly-eye lens) which is not shown, etc., through a mirror 122. The illuminated light converted for example to a collimated beam by the illuminating optical system 123 is vertically reflected by a dichroic mirror 126 through a condenser lens 125 and then the illuminating light illuminates the pattern area PA of a reticle R with a uniform intensity of illumination. In attendance to the pattern area PA, the reticle R is formed with a reticle mark RM comprising a rectangular transparent window and a diffraction grating mark. The plane of the variable blind 124 is in an image forming relation with the reticle R so that by opening and closing the movable blades forming the variable blind 124, it is possible to arbitrarily select the observation field of view (the illumination field of view during exposure) of the reticle R. After passing through the pattern area PA of the reticle R, the illuminating light enters a projection lens PL which is telecentric on both sides (or on one side) and the projection lens PL projects the images of the circuit pattern and the reticle mark RM on a wafer W. The wafer W is formed with wafer marks WM (alignment marks) of the diffraction grating type at given positions and its surface is formed with a resist layer (e.g., single-layer resist, multi-layer resist or color-incorporated resist) RG. The wafer W is mounted on a wafer stage 127 which is two-dimensionally movable in a step and repeat manner.

Also, arranged above the dichroic mirror 126 through a bifocal optical system 128 in the exposure apparatus is an alignment system of the TTR (through the reticle) type which simultaneously irradiates collimated laser beams from two directions on a diffraction grating mark to produce one-dimensional interference fringes and the alignment is effected by use of the interference fringes, more particularly an alignment system employing the heterodyne method which produces a given frequency difference between laser beams irradiated from two directions (hereinafter referred to as a laser interferometric alignment (LIA system).

While the LIA system is a well known alignment system thus omitting its detailed explanation, the reticle mark RM and the wafer mark WM are respectively irradiated by two light beams of different polarizations so that a beat signal is produced by subjecting to photoelectric conversion the ± first-order diffractions due to the movement of the interference fringes (corresponding to the frequency difference between the two light beams) produced on the marks RM and WM and the relative positional deviation between the reticle R and the wafer W is determined in accordance with the phase difference between the beat signal and a reference beat signal.

Figure 14:
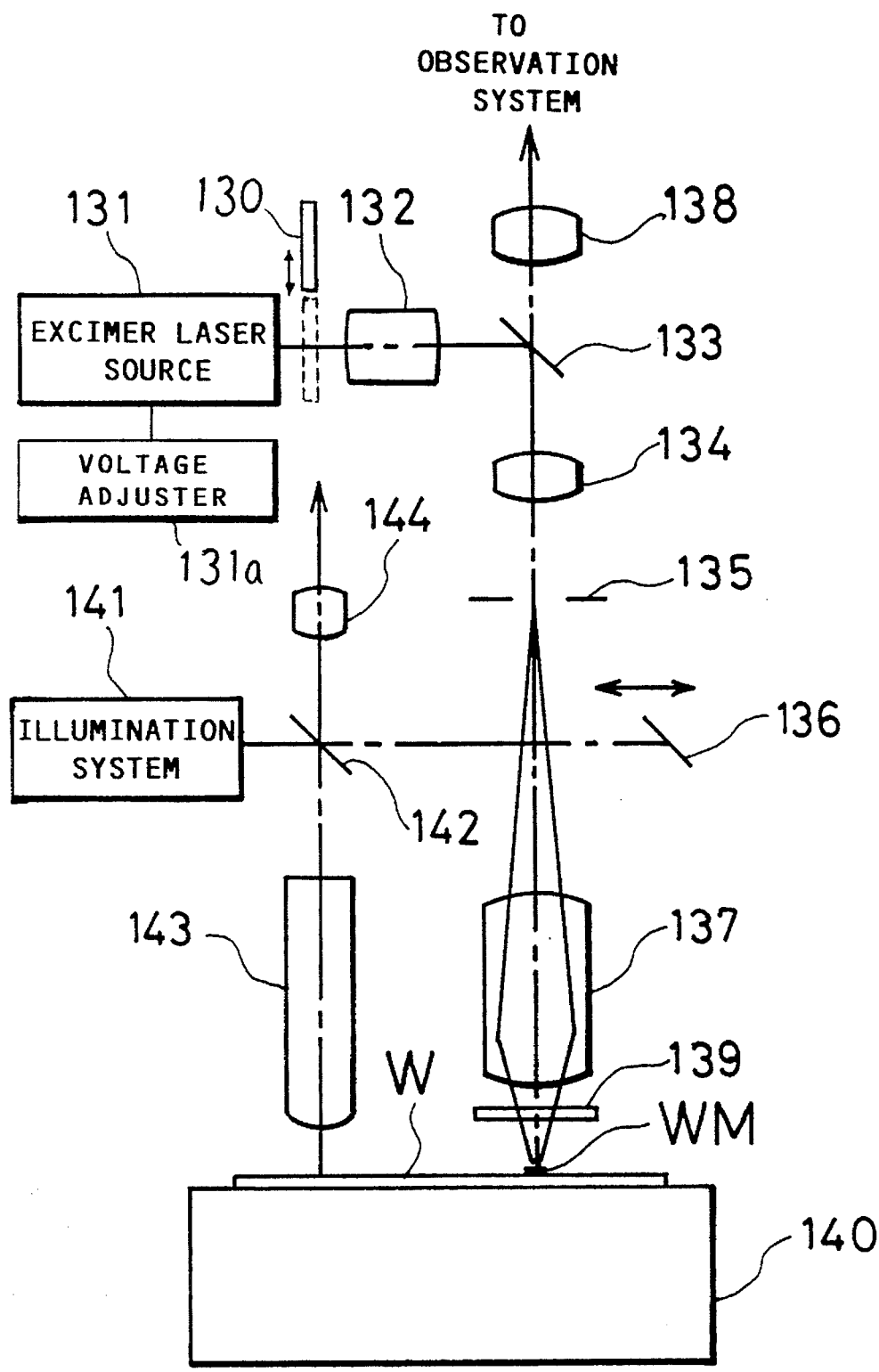
FIG. 14 is a schematic diagram showing an exemplary construction of the resist removing apparatus in the system shown in FIG. 12.

Referring now to FIG. 14, there is illustrated an example of the construction of the resist removing apparatus 120 used in the system shown in FIG. 12.

The resist removing apparatus 120 includes an excimer laser source 131 for resist removing purposes and an illumination system 141 for alignment purposes, and the excimer laser beam uniformly irradiates a variable aperture stop (variable aperture) 135 through a lens system 132, a beam splitter 133 and a lens system 134. The aperture image of the variable aperture 135 is formed in reduced form on the surface of the wafer W through a processing objective lens 137. Removably arranged between the objective lens 137 and the wafer W is a transparent protective sheet 139 for preventing contamination of the objective lens 137 during the processing.

The surface of the wafer W is coated with a resist layer and a contamination preventive film and the wafer W is mounted on a stage 140 whose position is measured by interferometers or the like so as to make a two-dimentional motion. Also, the alignment illuminating light from the illumination system 141 is reflected by a beam splitter 142, enters an alignment objective lens 143 and illuminates the surface of the wafer W uniformly. The reflected light from the mark WM on the wafer W is directed to the observation system through the objective-lens 143 and the beam splitter 142 and through a relay system 144. A wafer alignment system of the off-axis type is formed by the objective lens 143, the beam splitter 142 and the relay system 144.

Also, in order to directly observe a processing point (resist removal portion) through the processing objective lens 137, a beam splitter 136 is arranged so as to move into and out of the light path between the objective lens 137 and the variable aperture 135. When the beam splitter 136 is in the optical path, the illuminating light from the illumination system 141 is directed to the objective lens 137 thereby uniformly irradiating the processing portion on the wafer W. The reflected light from the surface of the wafer W enters the relay system 138 through the objective lens 137, the beam splitter 136 and the variable aperture 135 and via the lens system 134 and the beam splitter 133 and it is then directed to the observation system. In this case, the wafer W and the variable aperture 135 are conjugate to each other so that the aperture image of the variable aperture 135 and the processing portion on the wafer W are simultaneously observed through the relay system 138. In other words, after the stage 140 has been positioned in such a manner that the mark WM is positioned within the aperture of the variable aperture 135, the beam splitter 136 is retreated and the excimer laser beam (pulse light) is generated from the excimer laser light source 131, thereby removing the resist layer on the localized area including the wafer mark WM. With this construction, it is desirable that the beam splitter 133 is composed for example of a dichroic mirror having wavelength selectivity and the wavelength of the illuminating light from the illumination system 141 is in the visible region.

Then, in order to ensure accurate alignment between the pattern image of the reticle R and the shot area on the wafer W, it is expected to be promising to use an enhanced wafer global alignment method (hereinafter referred to as an enhanced global alignment=EGA method) such as disclosed in U.S. Pat. No. 4,780,617. In accordance with the EGA method, during the exposure of a single wafer W, the positions of the marks attendant to a plurality of shot areas on the wafer W are first measured (sample alignment) and then a total of six parameters including the offsets (the X and Y directions) of the wafer center position, the expansion and contraction (the X and Y directions) of the wafer W, the remaining amount of rotation of the wafer W and the perpendicularity of the wafer stage (or the perpendicularity of the array of the shot areas) are determined by a statistic procedure in accordance with the differences between the design positions of the marks and the measured positions of the marks. Then, in accordance with the values of the determined parameters, the position of the second shot to be subjected to overlay exposure is corrected from the design position and the wafer stage is successively stepped. The advantages of this method are that the throughput is improved as compared with the single-shot alignment method and that the sample alignment of a sufficient number of the marks results in averaging of the individual mark detection errors by a statistical calculation thereby ensuring the equivalent or greater alignment accuracy than that of the single-shot alignment method for all the shot areas over the whole surface of the wafer. Thus, in accordance with the present embodiment the alignment of the EGA type is effected by the use of the LIA system and the resist layer is locally removed from only the wafer marks WM attendant to the shot areas subject to sample alignment by means of the resist removing apparatus 120. As a result, not only the alignment can be effected with satisfactory accuracy but also the reduction in throughput due to the local removal of the resist layer can be reduced to a minimum.

Figure 15:
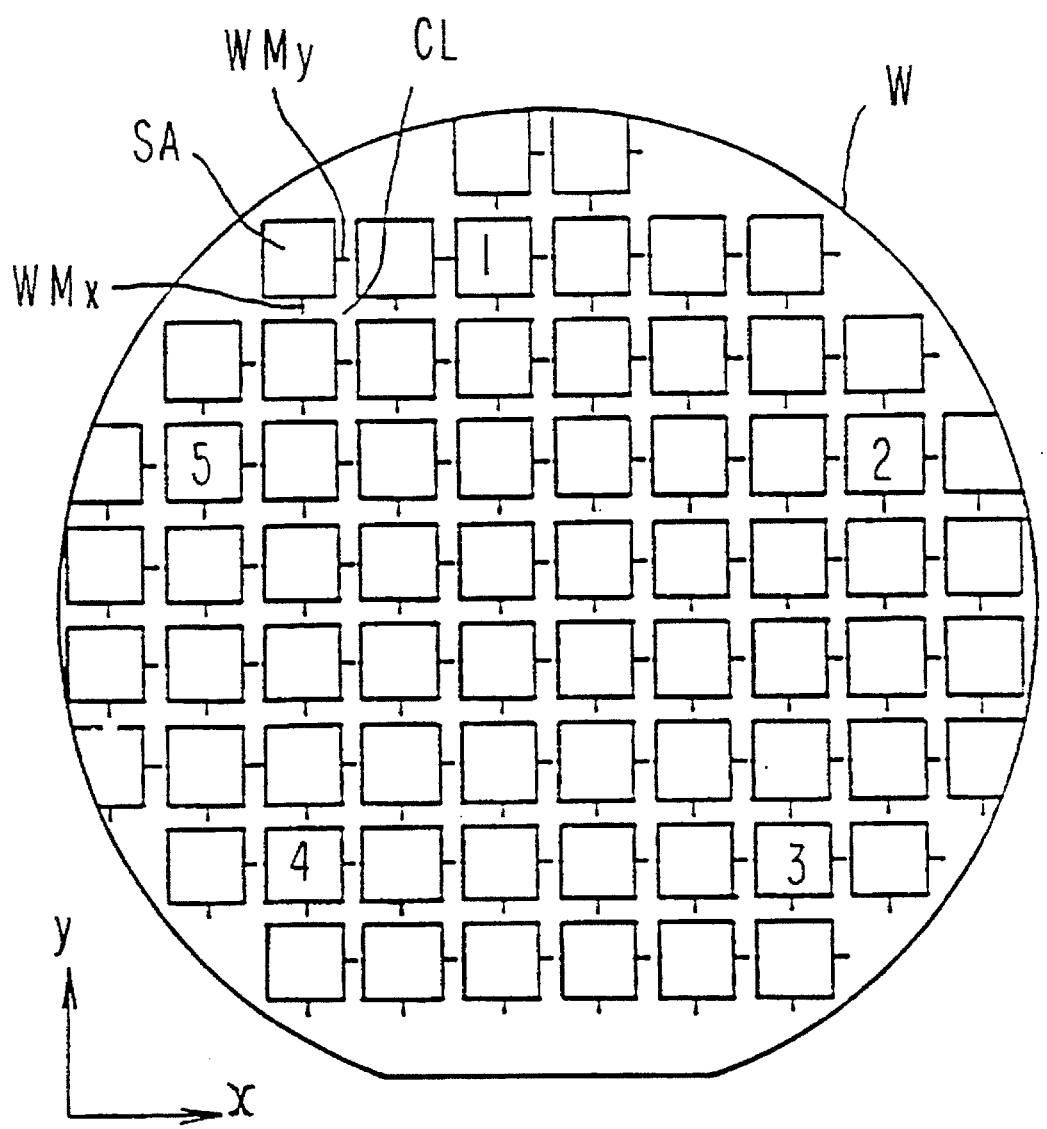
FIG. 15 is a plan view showing the arrangement of the shot areas and the wafer marks on a wafer.

FIG. 15 is a plan view showing the arrangement of shot areas SA and wafer marks WM on a wafer W, and FIG. 16 shows sectional views showing a sequence of operations for removing the resist on the wafer mark WM.

In FIG. 15, the shot areas SA are marked off from each other by narrow band-shaped scribe areas CL each extending in the x direction or the y direction. Also, each of the shot areas SA corresponds to the size of a circuit pattern area of the reticle R which is subjected to projection exposure at a time by the exposure apparatus 110. In the present embodiment, the x-direction and y-direction wafer marks WM are respectively provided at the two locations associated with each shot area SA so that the x-direction mark is designated as WMx and the y-direction mark is designated as WYy. Each of the wafer marks WMx and WMy is in the form of a diffraction grating mark (the duty ratio is 1:1) composed of a plurality of long grating elements (bar patterns) arranged in the x direction or the y direction.

In the present embodiment, when making the alignment of the EGA type by the LIA system prior to the exposure of a second layer reticle, the shot areas $SA_1$ to $SA_5$ shown in FIG. 15 are subjected to sample alignment and therefore it is only necessary to remove the resist layer RG of the areas including the wafer marks WMx and WMy associated with the shot areas $SA_1$ to $SA_5$.

In this case, the size of the resist layer RG to be removed (the size of a removal area DA, see FIG. 16) is selected so that it is smaller than the width of the scribe area CL and greater than the exclusive area of the wafer mark WM, e.g., the minimum area where the formation of any other pattern than a wafer mark is not allowed (a so-called mark forming area). Similarly, in the resist removing apparatus 120 the size of the irradiation area of the excimer laser beam LB (the aperture image of the variable aperture 135) is determined primarily. It is to be noted that the aperture size and shape of the variable aperture 135 can be varied arbitrarily and therefore they can be suitably changed to conform with the shape and size of the mark forming area (the removal area DA) including the wafer mark WM.

Figure 16A:
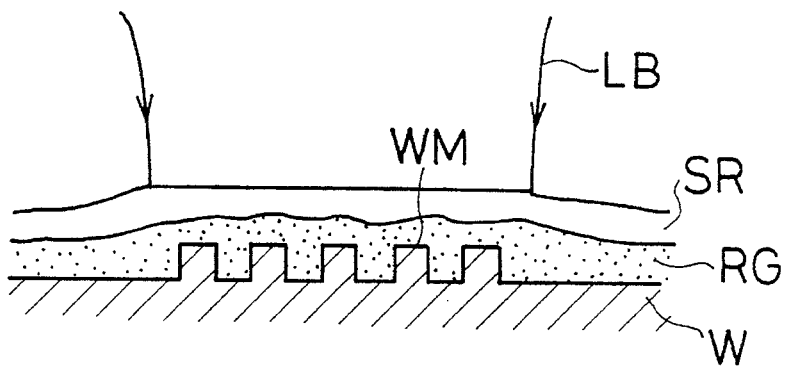
FIGS. 16A, 16B and 16C are sectional views showing the sequence of operations for removing the resist on the wafer mark.
Figure 16B:
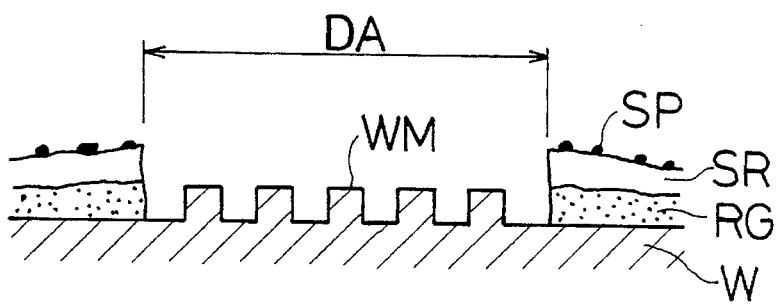
Figure 16C:
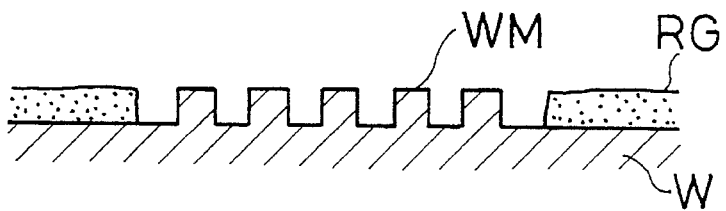
Figure 17A:
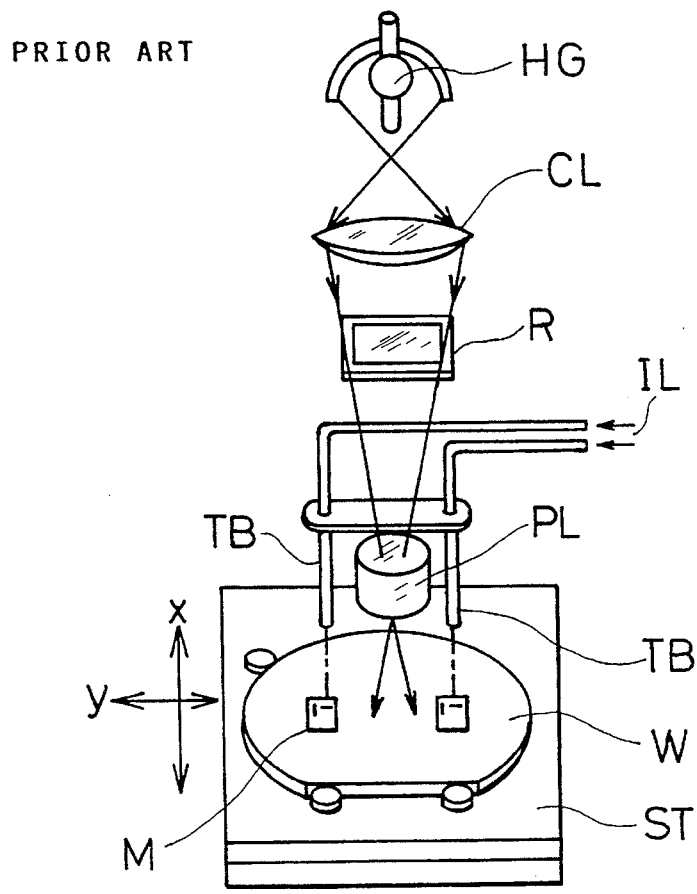
FIG. 17A is a schematic diagram showing the construction of a stepper employing a conventional resist removing method.
Figure 17B:
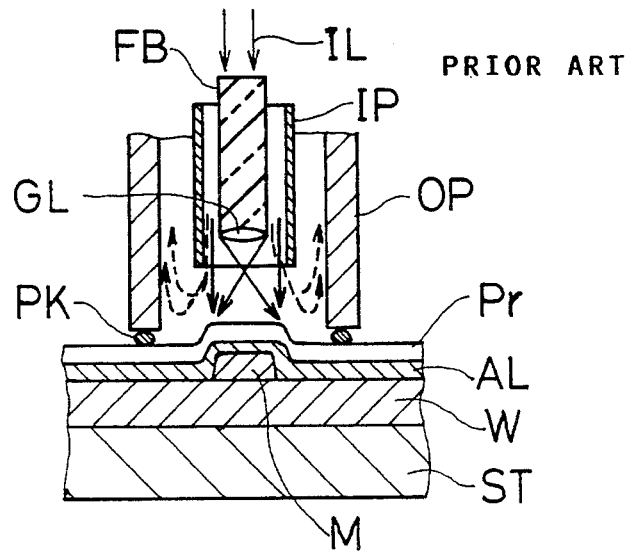
FIG. 17B is an enlarged partial sectional view showing the conditions of the resist removing section in the stepper of FIG. 17A.

In order to remove the resist on the wafer marks WM for the sample alignment to expose the marks WM, the wafer W which has been coated with a contamination preventive film SR on the resist layer RG is transferred from the coater/developer 115 (FIG. 12) to the resist removing apparatus 120 where the laser beam LB is irradiated on the wafer mark WM formed area as shown in FIG. 16A. When this occurs, the bonding of the molecules in the resist layer RG and the contamination preventive film SR which are composed of organic materials is broken and the materials are scattered. Also, a part of the materials is oxidized by the oxygen, etc., in the atmosphere and vaporized in the form of $CO_2$ and $H_2O$, thereby exposing the wafer mark WM as shown in FIG. 16B. In this case, while a part of the resist layer RG and the contamination preventive film SR is scattered around in the form of fine particles SP, these fine particles SR are deposited on the contamination preventive film SR. Thus, there is no danger of causing contamination of the resist layer RG below the contamination preventive film SR. Then, the wafer W is transferred from the resist removing apparatus 120 to the developing unit 113 of the coater/developer 115 so that the contamination preventive film SR on the resist layer RG is dissolved with pure water, the developing solution or the like as shown in FIG. 16C, thereby removing the fine particles SP along with the contamination preventive film SR.

After the sample alignment marks WM have been exposed in this way, the wafer W is transferred to the exposure apparatus 110 and the wafer alignment is made by the EGA method, thus avoiding deterioration in the alignment accuracy due to the resist layer and thereby ensuring the extremely accurate alignment. Moreover, there is no danger of causing damages, short circuiting, etc., of the pattern due to the scattered resist fine particles as in the past.

Here, if, for example, the resist is the positive type, a negative resist can be used as the contamination preventive film SR and other usable materials include ARC (Tradename: product of Brewer Science Co.) used for the purpose of reducing the generation of standing wave and polyvinyl-alcohol (hereinafter referred to as a PVA) used as a layer release film for the contrast enhancing layer (CEL).

Where a negative resist is used as the contamination preventive film, however, the developer must be used during the removal of the contamination preventive film and there is the possibility of the developer causing a detrimental effect on the positive resist. On the other hand, there are cases where the solvent contained in the ARC dissolves the resist and thus the ARC cannot be formed as a contamination preventive film on the surface of the resist in dependance on the kind of the resist.

On the contrary, the PVA is water soluble and pure water can be used during its application onto and removal from the resist, thereby causing no detrimental effect on the resist layer. However, since the PVA is transparent to the ultraviolet rays (the characteristic naturally possesed by it as the layer release film for CEL), the irradiated energy beam is not absorbed and there is no occurrence of such ablation process as caused in the resist layer RG. The removal of the contamination preventive film made of the PVA will principally be effected as the result of the impact force caused by the scattering of the resist by the laser beam tranmitted through the contamination preventive film or as the result of the stresses due to the thermal expansion caused at the boundary surface between the contamination preventive film and the resist layer attendant to the ablation process of the resist. Where the contamination preventive film is removed by such process, the irradiation of the energy beam of a high energy density results in the occurrence of a phenomenon that the PVA around the irradiated area is extensively stripped.

This behaviour will be explained with reference to FIGS. 18A to 18D. Firstly, as shown in FIG. 18A, a high energy density laser beam LB is irradiated on the desired removing area from above the contamination preventive film (PVA) SR which is uniformly applied onto the upper surface of the resist layer RG on the supporting substrate W. The laser beam LB is transmitted through the contamination preventive film SR so that it is absorbed by the top layer RU of the resist layer RG (FIG. 18B). In the top layer absorbing the laser beam LB, the resist decomposed due to the ablation process is scattered (FIG. 18B).

Due to the scattering energy of the resist at this time, the contamination preventive film SR in the laser irradiated area DA as well as the contamination preventive film SR in the surrounding area DB of the irradiated area are simultaneously scattered or stripped off. The extent of the removal of the surrounding contamination preventive film SR is increased in extent with increase in the energy density of the irradiated laser beam LB. In the surrounding area DB from which the contamination preventive film SR has been removed, as shown in FIG. 18D, the scattered result material SP caused by the irradiated laser beam LB is accumulated until the completion of the removal of the resist layer RG and thus there is the disadvantage of the contamination preventive film SR failing to serve its role with respect to the surrounding area DB.

If such scattered material SP is present, when the exposure of the resist layer RG is effected during the later lithographic operation, the exposure light to the surrounding area DB is intercepted or the scattered material SP is overheated thus causing changes in the properties of the resist surface in the surrounding are DB, thereby causing the resist to remain in the surrounding area DB even after the development. Such undesired residual resist extends to the pattern-formed portions during the etching and this causes a reduction in the yield.

The below-mentioned third embodiment of the present invention is so designed that when irradiating an energy beam selectively onto the thin film applied to a suporting substrate to remove the desired portions of the thin film, a contamination preventive film is deposited on the surface of the thin film so that in accordance with the absorption characteristic of the contamination preventive film with respect to the energy beam, the energy density of the energy beam or the irradiation extent of the energy beam is adjusted and the thus adjusted energy beam is irradiated onto the contamination preventive film, thereby removing the contamination preventive film and the thin film on the desired portion. Thereafter, the contamination preventive film on the unremoved thin film is removed. As a result, any contamination of the thin film surface around the removed area can be avoided.

Figure 19:
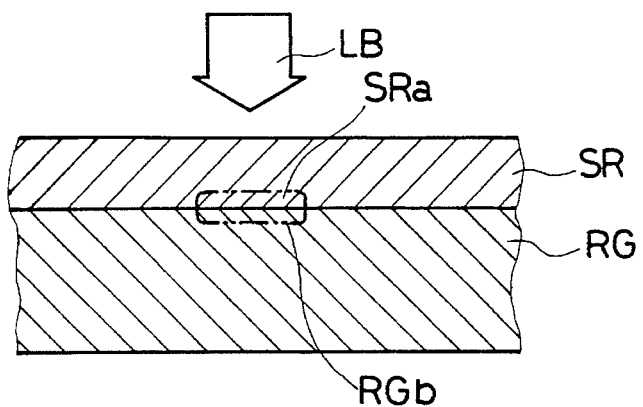
FIG. 19 is a shematic diagram for explaining the adjustment of the energy density according to a third embodiment of the present invention.

The adjustment of the energy beam in this third embodiment will be described with reference to FIGS. 19 and 20. Firstly, in FIG. 19 the contamination preventive film SR is deposited on the resist layer (thin film) RG and the beam LB is irradiated from above the contamination preventive film SR. In this case, consider first a case where the absorption of the beam LB by the contamination preventive film SR is small as compared with the absorption by the resist layer RG.

Assuming that $P_0$ represents the energy density of the beam LB irradiated, and $T(t)$ the transmittance (corresponding to the absorption characteristic) of the contamination preventive film SR with respect to the beam LB (when t represents the thickness of the contamination preventive film), the energy density P of the beam LB at the upper area RGb of the resist layer RG which is in contact with the contamination preventive film SR is given by the following equation (9)

$$P=P_o \cdot T(t) \quad (9)$$

Figure 20:
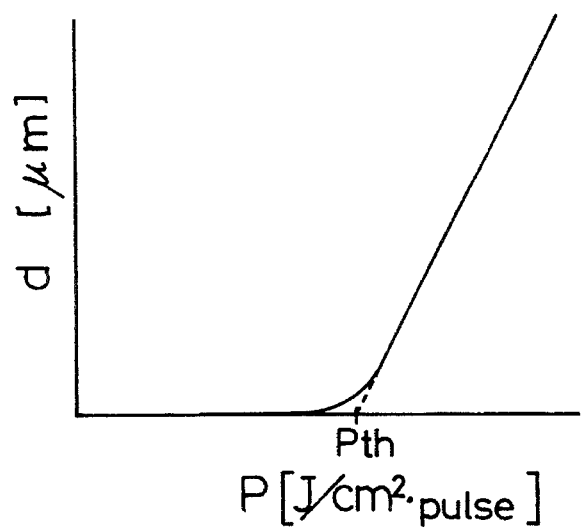
FIG. 20 is a graph showing the relation between the energy density of a resist removing beam and the depth of resist removal.

Also, the relation between the energy density P at the upper area RGb and the depth of removal d of the resist layer RG by the ablation process becomes as shown in FIG. 20. In other words, while the resist layer RG is not removed irrespective of the irradiation of the beam LB until the energy density P per unit pulse (J/cm².pulse) of the beam LB exceeds a threshold value Pth, the depth of removal d of the resist layer RG is increased in proportion to the energy density P.

As a result, if the energy density $P_0$ of the beam LB is adjusted in such a manner that the energy density P at the upper area RGb satisfied the following equation (10), the resist layer RG is very slightly decomposed and scattered by the minimum energy and consequently the contamination preventive film SR is removed.

$$P=P_o \cdot T(t)=Pth \quad (10)$$

At this time, the scattering energy of the resist layer RG is extremely small so that only the contamination preventive film SR in the irradiation area of the beam LB is removed. Thereafter(after the contamination preventive film SR in the irradiated area has been removed), even if the energy density of the beam LB is increased there is no stripping of the contamination preventive film SR around of the irradiated area. By thus adjusting the energy density of the irradiated beam LB, it is possible to prevent the contamination preventive film SR from being removed excessively beyond the area of the resist layer RG which is to be removed.

At this time, if the energy density of the beam LB is initially selected to be greater than the threshold value Pth, the scattering energy of the resist layer RG at the time of removal of the contamination preventive film SR becomes excessively large and thus even the contamination preventive film SR around the irradiated area is removed. However, by adjusting the irradiation area of the beam LB, it is possible to avoid any excessive removal of the contamination preventive film SR even if the energy density of the beam LB is initially selected high. In other words, if extent of irradiation of the beam LB is preliminarily selected to be small in anticipation of the extent over which the contamination preventive film SR will be removed beyond the irradiation extent and if, after the removal of the contamination preventive film SR, the irradiation extent of the beam LB is expanded in correspondance to the removing extent thereby removing the resist layer RG, any excessive removal of the contamination preventive film SR is prevented.

Then, while the forgoing description is directed to the case where the absorption of the beam LB by the contamination preventive film SR is low, if the absorption characteristic of the contamination preventive film SR with respect to the beam LB satisfies the condition which will be explained hereunder, the irradiation extent of the beam LB can be initially set to a size corresponding to the removing area of the resist layer RG and also the energy density of the beam LB can be initially selected greater than the threshold value Pth. In other words, while a threshold value Eth (corresponding to Pth in FIG. 20) of the energy density for the removal of the contamination preventive film SR by the ablation process should also be determined, it is conceivable that if the absorption of the contamination preventive film SR is high, in FIG. 19 the energy density E at the lower area SRa of the contamination preventive film SR which is in contact with the resist layer RG becomes equal to or higher than Eth $$\geq Eth \quad (11)$$

If this equation (11) holds, the contamination preventive film SR itself is removed by the ablation process so that even if the energy density of the beam LB is selected not less than Pth, the contamination preventive film SR is not removed beyond tha irradiated area. Suitable materials for use as a water-soluble contamination preventive film having an absorption characteristic which satisfies the condition of equation (11) include for example polyvinyl pirroliden (hereinafter referred to as PVP).

Figure 21:
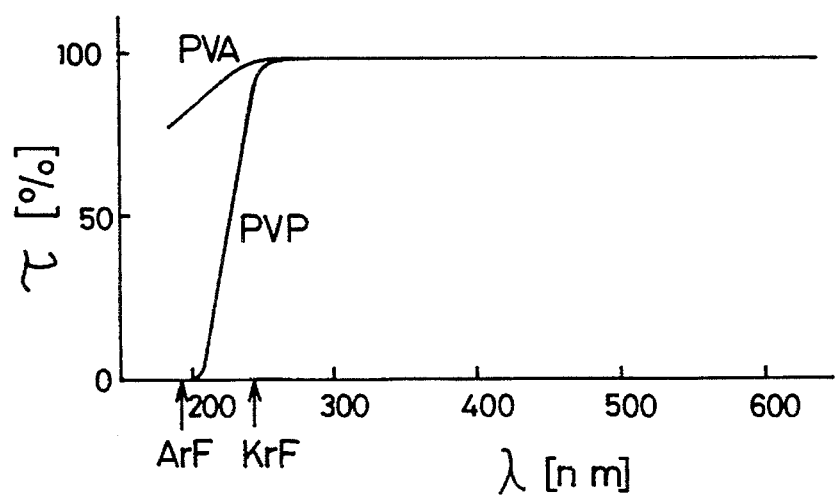
FIG. 21 is a graph showing the transmission spectral characteristic of PVA and PVP.

The water-soluble high-molecular PVA and PVP which are used as materials for the contamination preventive film will now be explained. The transmission spectral characteristics of these high molecular compounds are shown in FIG. 21. In FIG. 21, the abscissa represents the wavelength $\lambda$ (nm) and the ordinate represents the transmittance $\tau$ (%). As will be seen from FIG. 21, both of these high molecular compounds have transmittances of over 90% for the wavelength of the Excimer laser beam, e.g., KrF laser beam (248 nm) and practically no laser beam is absorbed. Also, the PVA has a transmittance of over 90% for the ArF laser beam (193 nm), whereas the PVP does not practically transmit any beam of this wavelength and it shows a high absorption.

As a result, if the ArF laser beam is used as an energy beam and the PVP is deposited as a contamination preventive film on the surface of the resist, the condition of the previously mentioned equation (11) can be satisfied and the contamination preventive film itself is removed by the ablation process. In this case, it is only necessary that the irradiation extent of the laser beam is set to a size corresponding to the removing area of the resist layer and the energy density of the beam is set to a value sufficient to obtain an effective resist removing rate.

If the contamination preventive film is composed of the PVP alone, however, there is the danger of causing an inconvenience that the properties of the PVP are changed due to the heat caused as the result of the irradiation of the laser beam and its solubility to water is deteriorated. This inconvenience can be overcome by using it with the PVA which has an excellent solubility to water. In other words, by miking the PVA and PVP and using as a contamination preventive film, it is possible to provide it with the two characteristic including the solubility to water and the absorption for the laser beam. In addition to mixing the PVA and PVP for use, the PVP may be laminated on the PVA serving as a lower layer.

Where the PVA and PVP are mixed and used, it is necessary to adjust the ratio between the PVA and PVP on the basis of one-to-one correspondence as a standard. However, if the proportion of the PVA is increased, while the solubility to water is increased, the absorption for the laser beam is decreased. If the absorption for laser beam is deteriorated, the condition of the previously-mentioned equation (11) is not satisfied (i.e., E<Eth) and it is predicted that the contamination preventive film is not removed by the ablation process. Also, where the KrF laser beam is used as the irradiation beam, the contamination preventive film is not removed by the ablation process irrespective of either one of the PVA and PVP is used. In such a case, the contamination preventive film is removed by the scattering energy of the resist layer so that in order to prevent any excessive removal of the contamination film, it is necessary to decrease the energy density of the beam or reduce the irradiation extent.

An example of a specific resist removing operation accordimg to the third embodiment will be described with reference to FIGS. 22A to 22D.

Figure 22A:
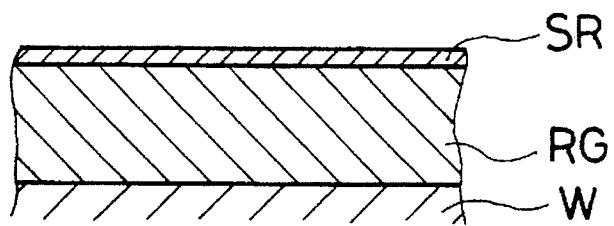
FIGS. 22A to 22D are diagrams showing the concept of the resist removing steps according to the third embodiment.

Firstly, as shown in FIG. 22A, prior to the irradiation of a laser beam LB, a contamination preventive film SR is deposited on the surface of a resist layer RG on a supporting substrate (wafer) W. At this time, the contamination preventive film SR may be uniformly deposited over the whole surface of the resist layer RG or alternatively it may be deposited only over a given extent centering a removing area where the occurrence of contamination is expected if circumstances require.

Figure 22B:
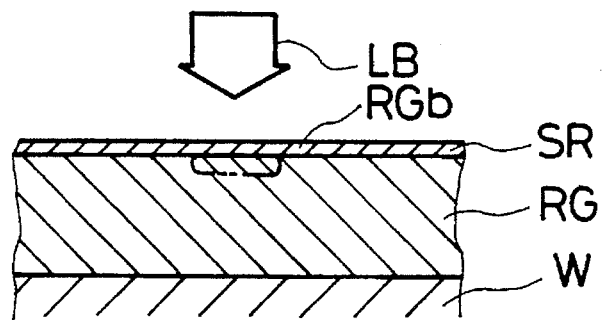

Then, as shown in FIG. 22B, the laser beam LB is irradiated onto the removing area of the resist layer RG from above the contamination preventive film SR. At this time, if the absorption of the beam LB by the contamination preventive film SR is low so that condition of the previously mentioned equation (11) is not satisfied, the energy density of the beam is set to the minimum value (the threshold value Pth of FIG. 20) which is sufficient to realize the removal of the resist layer by the ablation process.

Figure 22C:
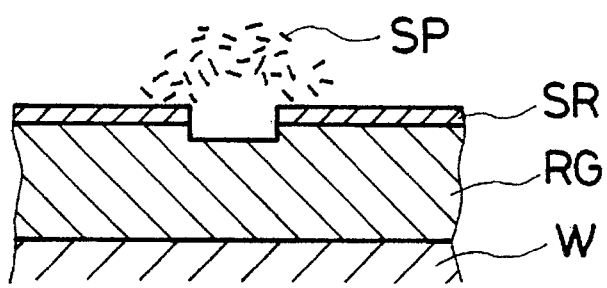

When the beam LB having the energy density of the threshold value Pth is irradiated, as shown in FIG. 22C, the molecular bond of the irradiated surface portion RGb of the resist layer RG is broken by a photon energy so that the resist is converted to fine particulete matter and scattered (scattered material SP), thereby also scattering and removing the contamination preventive film forming the upper layer.

Figure 22D:
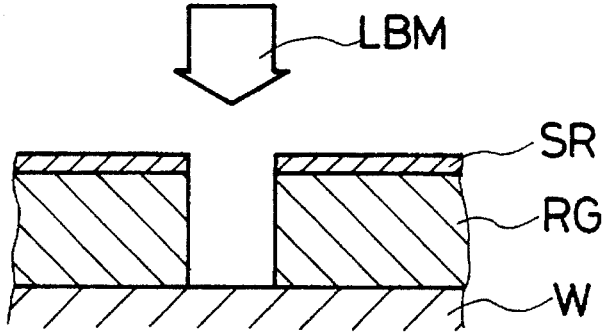

At this time, the scattering energy of the resist is very small and thus the contamination preventive film SR is not removed beyond the irradiation area of the beam. A part of the scatterd material SP is discharged into the atomosphere and another part is accumulated on the contamination preventive film SR. After the contamination preventive film SR in the irradiated area has been removed, even if a high energy beam is irradiated onto the same irradiated area, the contamination preventive film SR around it is not removed. Thus, as shown in FIG. 22D, a beam LBM having higher energy density is irradiated thereby completely removing the resist layer RG. At this time, the resulting scattered material SP is accumulated on the surrounding contamination preventive film and therefore the surface of the resist layer RG is not contaminated.

After the removal of the resist layer RG has been completed, the contamination preventive film SR is dissolved and removed and the whole operation is completed. In accordance with the third embodiment, the contamination preventive film SR is water soluble so that its removal can be easily realized by performing a short-time pure water washing (so-called spin wash) and then performing the drying by a so-called spin dry, and there is no danger of causing any deterioration in the properties of the resist layer.

Referring now to FIGS. 23A to 23D, there are illustrated schematic diagrams showing in due order the series of resist removing steps according to a fourth embodiment of the invention.

Figure 23A:
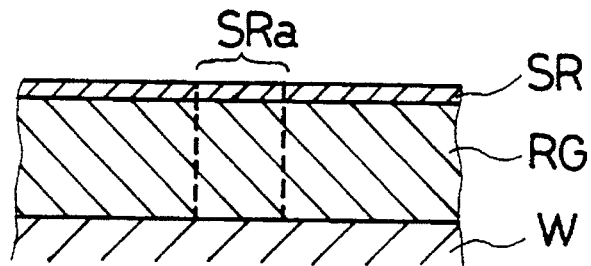
FIGS. 23A to 23D are diagrams showing the concept of the resist removing steps according to a fourth embodiment of the present invention.

In FIG. 23A, as in the case of the third embodiment, a resist layer RG is applied onto a supporting substrate W (wafer) and a contamination preventive film SR is deposited on the surface of the resist layer RG. This contamination preventive film SR is assumed to be low in absorption for the beam used for removing the resist layer RG.

In this fourth embodiment, the energy density of the laser beam is not changed and instead the area of its irradiation extent is changed in the course of the operation.

Figure 23B:
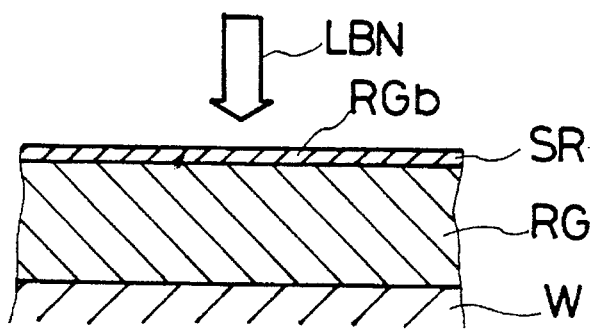

In other words, as shown in FIG. 23B, in anticipation of the amount by which the contamination preventive film is excessively removed beyond the irradiation extent of the beam LBN, the irradiation extent of the LBN is preliminarily set to an area smaller than a removing area SRa.

Figure 23C:
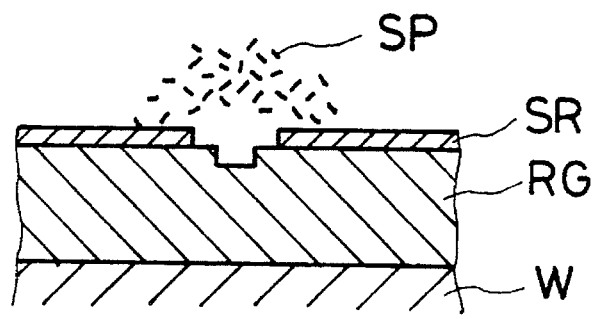

When the laser beam LBN reduced in beam diameter in this way is irradiated, as shown in FIG. 23C, in the surface portion RGb of the resist layer RG which is smaller in extent than the removing area SRa, the molecular bond is broken by a photon energy so that the resist of the surface portion RGb is scattered in the form of fine particles (scattered material SP) and the resulting scattering energy also causes the upper-layer contamination preventive film to be scattered and removed. In this case, the scattering energy of the resist is so large that the comtamination preventive film SR is stripped beyond the irradiation area of the beam LBN and a part of the scattered material SP is also deposited on the exposed resist layer RG.

However, since the irradiation extent of the beam LBN is preliminarily set to the smaller area, the exposed portion of the resist layer RG is contained within the removing area SRa and thus the deposition of the scattered material SP on this portion gives rise to no difficulty.

Figure 23D:
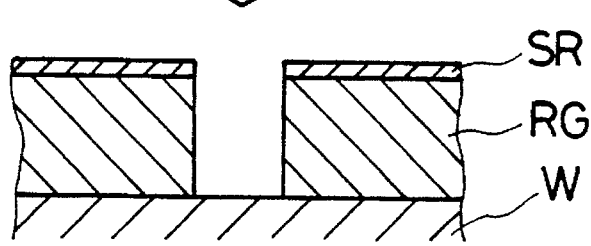

After the contamination preventive film SR in the removing area SRa has been removed, as shown in FIG. 23D, a beam LB expanded in irradiation extent in correspondance to the removing area SRa is irradiated thereby completely removing the resist layer RG in the removing area SRa. At this time, the resist layer RG is protected by the contamination preventive film SR so that the resulting scattered material SP is accumulated on the contamination preventive film SR and the resist layer RG is not contaminated. After the removal of the resist layer RG has been completed, the contamination preventive film SR is dissolved and removed as in the case of third embodiment.

To perform the above-mentioned third embodiment or fourth embodiment, the resist removing apparatus shown in the previously mentioned FIG. 14 may for example be used.

In this case, in order to perform the third embodiment, the applied voltage to the resist removing excimer laser 131 is adjusted by a voltage adjustor 131a and the excimer laser 131 is adapted in a manner that the energy density of its output beam is varied through the adjustment of the applied voltage. Alternatively, it is possible to arrange so that a filter 130 can be selectively arranged in the optical path of the beam from the resist removing excimer laser light source 131 and thus the energy density of the excimer laser beam can be adjusted by moving the filter 130 into and out of the optical path. In other words, as for example, where the filter 130 is moved into the optical path at the start so that the energy density of the excimer laser beam is decreased, at the stage that the contamination preventive film has been removed, the filter 130 is retreated to increase the energy density of the beam and the removal of the resist layer is continued until the wafer mark is exposed.

Also, in order to perform the fourth embodiment, the beam diameter of the excimer laser beam is varied by the variable aperture 135. If, for example, the opening of the variable apreture 135 is preliminarily selected to be smaller than the removing area, at the satage that the contamination preventive film has been removed, the opening is widened in correspondance to the removing area and the irradiation of the excimer laser beam is continued until the wafer mark WM is exposed.

Of course, the adjustment of the energy density by the voltage adjustor 131a or the filter 130 and the adjustment of the irradiation extent by the variable aperture 135 may be effected in combination. Also, in this case, after the contamination preventive film has been removed, the irradiation extent is adjusted to a size correspondimg to the removing area and the energy density is set to a magnitude that ensures an effective resist removing rate.

Further, although not shown, by arranging in the vicinity of the removing area a detecting element for detecting a change in the optical or physical characteristic of the removing area so that the presence or absence of the contamination preventive film is determined to control the change of the setting of the voltage adjustor 131a, the insertion and retraction of the filter 130 or the change of the opening diameter setting of the variable aperture 135 and also the end point of the resist removal is discriminated to stop the irradiation of the excimer laser beam, it is possible to avoid any damage to the wafer alignment mnark due to the irradiation of the laser beam having an excessive energy density or an excessive irradiation extent.

Also, in order to effect the selective removal of the resist according to the processing steps of the third embodiment, it is preferable to form a system of the type in which such resist removing apparatus as shown in FIG. 14 is incorporeted in a so-called coater/developer including a resist coater and a resist developer in one unit (e.g., the system described in connection with FIG. 12) so that after the resist and the contamination preventive film have been applied by the coater of the coater/developer, the wafer is transferred to the resist removing apparatus to remove the resist on the selected portion and then, after the contamination preventive film has been dissolved and removed by the developer of the coater/developer, the wafer is tranferred from the developer to an exposure apparatus.

While, in the foregoing description, the contamination preventive film comprises a water-soluble high molecular film, it is needless to say that the contamination preventive film may be composed of an ARC, negative resist or the like provided that there is no detrimental effect on the resist layer used. Further, the method of removing the contamination preventive film at the final step is not limited to the removal by dissolution and any physical method may be used.

While, in the foregoing description, the removal of the resist layer from the areas formed with the wafer marks WM has been described in detail, it is needless to say that the each of the methods of respective embodiments is equally applicable to cases where the resist is directly processed to form a desired pattern form by the photo etching method.

What is claimed is:

1. A removal apparatus for removing a resist layer from a substrate on which an alignment mark is exposed by irradiating an energy beam, the removal apparatus comprising:

a rotatable table having a center of rotation and adapted to support said substrate so that said substrate rotates when said table rotates;

detection means for detecting the position of said alignment mark on said substrate;

means for providing design position information of said alignment mark in a rectangular coordinate system;

means for calculating said position of said alignment mark in the polar coordinate system based on said center of rotation of said table in accordance with said design position information and said position of said alignment mark detected by said detection means; and an irradiation device adapted to irradiate said resist layer which covers said alignment mark with said energy beam during the rotation of said table and said substrate in accordance with the result of said calculation means.

2. An apparatus according to claim 1, wherein said irradiation device includes a laser source of shooting pulse laser beams as said energy beam.

3. An apparatus according to claim 1, wherein a contamination preventive film is provided on the surface of said resist layer.

4. An apparatus according to claim 3, wherein said irradiation device includes means for changing the energy density of said energy beam.

5. An apparatus according to claim 1, wherein said irradiation device includes means for changing the energy density of said energy beam.

6. An apparatus according to claim 5, wherein said energy density changing means has a filter inserted in the path of said energy beam.

7. A removal apparatus for removing a resist layer from a substrate on which an alignment mark is exposed by irradiating an energy beam, the removal apparatus comprising:

a rotatable table having a center of rotation and adapted to support said substrate so that said substrate rotates when said table rotates;

a rotation angle detector which detects the rotation angle of said table from a predetermined position;

detection means which move in an arbitrary manner to detect the position of said alignment mark on said substrate;

means for providing design position information of said alignment mark in a rectangular coordinate system;

means for calculating said position of said alignment mark in the polar coordinate system based on said center of rotation of said table in accordance with said design position information and said position of said alignment mark detected by said detection means; and an irradiation device movable in a direction toward and away from said center of rotation of said table, and parallel to said table adapted to irradiate said resist layer which covers said alignment mark with said energy beam in accordance with the result of said calculation means, so that said irradiation device removes said resist layer with which said alignment mark is covered during the rotation of said table and said substrate.

8. An apparatus according to claim 7, wherein said irradiation device has a changeable aperture which changes the irradiation area of said energy beam.

9. An apparatus according to claim 8, wherein said changeable aperture rotates according to the rotation angle of said table.

10. A removal apparatus for removing a resist layer from a substrate on which an alignment mark is exposed by irradiating an energy beam, the removal apparatus comprising:

a rotatable table having a center of rotation and adapted to support and rotate said substrate so as to spread said resist layer on said substrate and to remove a part of said resist layer;

detection means for detecting the position of said alignment mark on said substrate;

means for providing design position information of said alignment mark in a rectangular coordinate system;

means for calculating said position of said alignment mark in the polar coordinate system based on said center of rotation of said table in accordance with said design position information and said position of said alignment mark detected by said detection means; and an irradiation device adapted to irradiate said resist layer which covers said alignment mark with said energy beam during the rotation of said table and said substrate in accordance with the result of said calculation means.

* * * * *